(12) United States Patent
Huang et al.

(10) Patent No.: US 12,148,358 B2
(45) Date of Patent: Nov. 19, 2024

(54) SCAN CIRCUIT AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Meng Li, Beijing (CN); Tianyi Cheng, Beijing (CN); Doyoung Kim, Beijing (CN); Long Ma, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/760,495

(22) PCT Filed: Nov. 1, 2021

(86) PCT No.: PCT/CN2021/127843
§ 371 (c)(1),
(2) Date: Aug. 10, 2022

(87) PCT Pub. No.: WO2023/070647
PCT Pub. Date: May 4, 2023

(65) Prior Publication Data
US 2024/0185766 A1    Jun. 6, 2024

(51) Int. Cl.
*G09G 3/32*    (2016.01)

(52) U.S. Cl.
CPC ....... *G09G 3/32* (2013.01); *G09G 2300/0408* (2013.01); *G09G 2300/0426* (2013.01); *G09G 2310/0267* (2013.01); *G09G 2310/08* (2013.01); *G09G 2320/0223* (2013.01)

(58) Field of Classification Search
CPC ............. G09G 2300/0408; G09G 3/32; G09G 2300/0426; G09G 2310/0267; G09G 2320/0223; G09G 2310/08
See application file for complete search history.

(56) References Cited

U.S. PATENT DOCUMENTS

2019/0304374 A1* 10/2019 Wang .................. H10K 59/131
2021/0225256 A1*  7/2021 Byun ...................... G09G 3/20
2021/0335263 A1* 10/2021 Byun ...................... G09G 5/10

* cited by examiner

*Primary Examiner* — Muhammad N Edun
(74) *Attorney, Agent, or Firm* — Intellectual Valley Law, P.C.

(57) ABSTRACT

A scan circuit is provided. The scan circuit includes a plurality of stages. A respective stage of the scan circuit includes a second processing subcircuit, which includes a first capacitor, a sixth transistor, and a seventh transistor. The respective stage of the scan circuit further includes a sixth connecting line connecting a first electrode of the seventh transistor, a second electrode of the sixth transistor, and a second capacitor electrode of the first capacitor together. The sixth connecting line crosses over both the first capacitor electrode and the second capacitor electrode of the first capacitor.

18 Claims, 29 Drawing Sheets

ACT6

SCAN CIRCUIT AND DISPLAY APPARATUS

CROSS-REFERENCE TO RELATED APPLICATION

This application is a national stage application under 35 U.S.C. § 371 of International Application No. PCT/CN2021/127843, filed Nov. 1, 2021, the contents of which are incorporated by reference in the entirety.

TECHNICAL FIELD

The present invention relates to display technology, more particularly, to a scan circuit and a display apparatus.

BACKGROUND

Image display apparatuses include a driver for controlling image display in each of a plurality of pixels. The driver is a transistor-based circuit including a gate driving circuit and a data driving circuit. The gate driving circuit is formed by cascading multiple units of shift register units. Each shift register unit outputs a gate driving signal to one of a plurality of gate lines. The gate driving signals from the gate driving circuit scan through gate lines row by row, controlling each row of transistors to be in on/off states. The gate drive circuit can be integrated into a gate-on-array (GOA) circuit, which can be formed directly in the array substrate of the display panel.

SUMMARY

In one aspect, the present disclosure provides a scan circuit, comprising a plurality of stages; wherein a respective stage of the scan circuit comprises a second processing subcircuit, which comprises a first capacitor, a sixth transistor, and a seventh transistor; the respective stage of the scan circuit further comprises a sixth connecting line connecting a first electrode of the seventh transistor, a second electrode of the sixth transistor, and a second capacitor electrode of the first capacitor together; and the sixth connecting line crosses over both the first capacitor electrode and the second capacitor electrode of the first capacitor.

Optionally, the scan circuit comprises a first capacitor electrode of the first capacitor and a gate electrode of the sixth transistor; the first capacitor electrode of the first capacitor and the gate electrode of the sixth transistor are parts of a unitary structure; and the first capacitor electrode of the first capacitor has a L shape, a first part of the first capacitor electrode extending substantially along the first direction, a second part of the first capacitor electrode extending substantially along the second direction.

Optionally, the respective stage of the scan circuit further comprises an input subcircuit comprising a first transistor, and an input signal line configured to provide an input signal to the first transistor, a portion of the input signal line extending substantially along the second direction; and a ratio of a width along the first direction of the first part to a shortest distance between the first part and the portion extending substantially along the second direction is no more than 2.0:1.

Optionally, the second capacitor electrode of the first capacitor has a L shape, a third part of the second capacitor electrode extending substantially along a first direction, a fourth part of the second capacitor electrode extending substantially along the second direction; and a ratio of a width along the first direction of the third part to a shortest distance between the third part and the portion extending substantially along the second direction is no more than 2.0:1.

Optionally, an overlapping area between a first capacitor electrode and the second capacitor electrode of the first capacitor is no more than 400 $\mu m^2$.

Optionally, a portion of a semiconductor material layer comprising an active layer of the sixth transistor has a dumbbell shape; the portion of the semiconductor material layer is connected to a first electrode and a second electrode of the sixth transistor respective at positions corresponding to two heads of the dumbbell shape; a rod connecting the two heads comprises the active layer of the sixth transistor; and widths along a second direction of the two heads are greater than a width along the second direction of the rod.

Optionally, a ratio of channel width to channel length of the active layer of the sixth transistor is in a range of 0.8:1 to 1:0.8.

Optionally, the respective stage of the scan circuit further comprises an output subcircuit, which comprises a ninth transistor; a first electrode of the ninth transistor is configured to be provided with a first power supply signal; an active layer of the ninth transistor comprises m numbers of channels parts spaced apart from each other, m is an integer greater than 2; a respective channel part of the active layer of the ninth transistor has a channel width and a channel length; and a ratio of (m*the channel width of the respective channel part) to the channel length of the respective channel part is greater than 22:1.

Optionally, the active layer of the ninth transistor has a channel length of 3.5 $\mu m$; and an active layer of the sixth transistor has a channel length of 3.3 $\mu m$.

Optionally, the respective stage of the scan circuit further comprises an output subcircuit, which comprises a tenth transistor; a first electrode of the tenth transistor is configured to be provided with a second power supply signal; an active layer of the tenth transistor comprises n numbers of channels parts spaced apart from each other, n is an integer greater than 2; a respective channel part of the active layer of the tenth transistor has a channel width and a channel length; and a ratio of (n*the channel width of the respective channel part) to the channel length of the respective channel part is greater than 13:1.

Optionally, the respective stage of the scan circuit further comprises an input subcircuit comprising a first transistor, and an input signal line configured to provide an input signal to the first transistor; the input signal line comprises a first line portion and a second line portion in two different layers, respectively; and the second line portion comprises at least a portion of the input signal line extending along a part of a periphery of a first capacitor electrode of the first capacitor in a preceding stage of the scan circuit.

Optionally, the respective stage of the scan circuit further comprises an output subcircuit, which comprises a ninth transistor and a tenth transistor; an output signal line connected to second electrodes of the ninth transistor and the tenth transistor; and an electrostatic discharge portion configured to discharge electrostatic charges accumulated in the output signal line.

Optionally, the output signal line is in a third conductive layer; the electrostatic discharge portion is in a first signal line layer; and the electrostatic discharge portion is connected to the output signal line through one or more vias extending through a passivation layer.

Optionally, the electrostatic discharge portion has a structure that extends from a first signal line layer through one or more vias to a third conductive layer.

Optionally, the sixth connecting line has a L shape; a first-sixth connecting line part of the sixth connecting line extends substantially along the first direction; a second-sixth connecting line part of the sixth connecting line extends substantially along the second direction; and the second-sixth connecting line part is a part of the sixth connecting line wherein the sixth connecting line connects to the second capacitor electrode of the first capacitor.

Optionally, the respective stage of the scan circuit further comprises a ninth connecting line in a first signal line layer, the ninth connecting line connecting a second electrode of a second transistor, a first electrode of an eleventh transistor, a second electrode of a third transistor, and a fifth connecting line together.

Optionally, a first-ninth connecting line part of the ninth connecting line extends substantially along a first direction, the first-ninth connecting line part being a part of the ninth connecting line where the ninth connecting line connects to a second electrode of a third transistor; a second-ninth connecting line part of the ninth connecting line extends substantially along a second direction, the first-ninth connecting line part and the second-ninth connecting line part being commonly connect to the second electrode of the second transistor; and a third-ninth connecting line part of the ninth connecting line extends substantially along the first direction, the third-ninth connecting line part being a part of the ninth connecting line where the ninth connecting line connects to a first electrode of an eleventh transistor and connects to the fifth connecting line.

Optionally, the respective stage of the scan circuit comprises a grid of connecting lines comprising a second connecting line and a fifth connecting line in a first conductive layer, and a seventh connecting line, an eighth connecting line, and a ninth connecting line in a first signal line layer.

Optionally, the second connecting line connects a gate electrode of an eighth transistor, a second electrode of a thirteenth transistor, a first electrode of a twelfth transistor, and a gate electrode of a second transistor together; the fifth connecting line connects the ninth connecting line to a gate electrode of a fifth transistor; the seventh connecting line connects a first electrode of the sixth transistor, a first electrode of a fourth transistor, a gate electrode of the seventh transistor together; the eighth connecting line connects a second electrode of an eleventh transistor to a gate electrode of the sixth transistor; and the ninth connecting line connects a second electrode of a second transistor, a first electrode of the eleventh transistor, a second electrode of a third transistor, and the fifth connecting line together.

Optionally, at least a portion of the seventh connecting line, at least a portion of the eighth connecting line, and at least a portion of the ninth connecting line extend substantially along the second direction; at least a portion of the second connecting line and at least a portion of the fifth connecting line extend substantially along the first direction; the fifth connecting line and the ninth connecting line are connected to each other through vias; the ninth connecting line crosses over the second connecting line; the eighth connecting line crosses over the second connecting line and the fifth connecting line; and the seventh connecting line crosses over the second connecting line and the fifth connecting line.

Optionally, the respective stage of the scan circuit first comprises a first processing subcircuit, which comprises a second capacitor, an eighth transistor, and a thirteenth transistor; a first capacitor electrode of the second capacitor and a second electrode of the eighth transistor are connected to a second electrode of the seventh transistor; a gate electrode of the eighth transistor is connected to a second electrode of the thirteenth transistor; first electrodes of the eighth transistor and the thirteenth transistor are configured to be provided with a first power supply signal; and a gate electrode of the thirteenth transistor is configured to provide the first power supply signal when an emission driving circuit of the scan circuit is in operation, and is configured to provide a second power supply signal when the emission driving circuit of the scan circuit is not in operation.

In another aspect, the present disclosure provides a display apparatus, comprising the scan circuit described herein, and a display panel comprising a plurality of light emitting elements.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a scan circuit and a display apparatus that substantially obviate one or more of the problems due to limitations and disadvantages of the related art. In one aspect, the present disclosure provides a scan circuit having a plurality of stages. In some embodiments, a respective stage of the scan circuit includes a second processing subcircuit, which includes a first capacitor, a sixth transistor, and a seventh transistor. The respective stage of the scan circuit further includes a sixth connecting line connecting a first electrode of the seventh transistor, a second electrode of the sixth transistor, and a second capacitor electrode of the first capacitor together. The sixth connecting line crosses over both the first capacitor electrode and the second capacitor electrode of the first capacitor.

Figure 1:
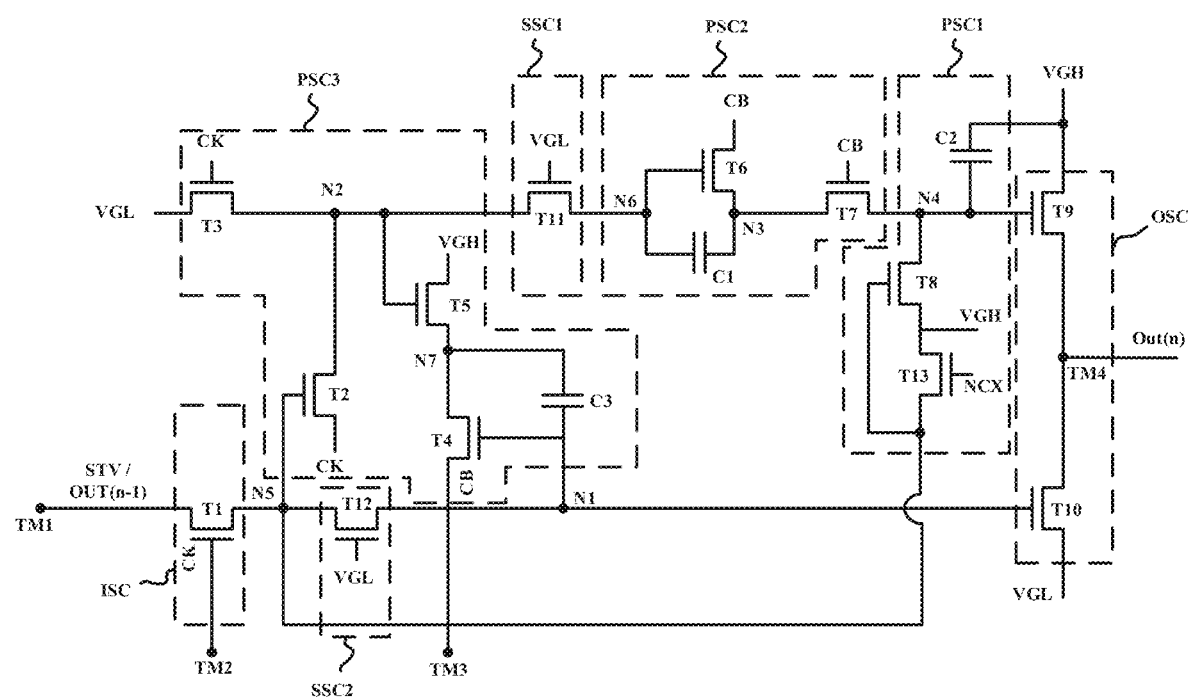
FIG. 1 is a circuit diagram of a stage of scan circuit in some embodiments according to the present disclosure.

FIG. 1 is a circuit diagram of a stage of scan circuit in some embodiments according to the present disclosure. Referring to FIG. 1, the stage of scan circuit in some embodiments includes an input subcircuit ISC, an output subcircuit OSC, a first processing subcircuit PSC1, a second processing subcircuit PSC2, a third processing subcircuit PSC3, a first stabilizing subcircuit SSC1, and a second stabilizing subcircuit SSC2.

In some embodiments, the output subcircuit OSC is configured to supply the voltage of a first power supply VGH or a second power supply VGL to an output terminal TM4 in response to voltages of a fourth node N4 and a first node N1. Optionally, the output subcircuit OSC includes a ninth transistor T9 and a tenth transistor T10.

The ninth transistor T9 is coupled between a first power supply VGH and the output terminal TM4. A gate electrode of the ninth transistor T9 is coupled to the fourth node N4. The ninth transistor T9 may be turned on or off depending on the voltage of the fourth node N4. Optionally, when the ninth transistor T9 is turned on, the voltage of the first power supply VGH is provided to the output terminal TM4, which (annotated as Out(n) in FIG. 1) may be transmitted to a n-th gate line and used as a gate driving signal having a gate-on level.

The tenth transistor T10 is coupled between the output terminal TM4 and a second power supply VGL. A gate electrode of the tenth transistor T10 is coupled to the first node N1. The tenth transistor T10 may be turned on or off depending on the voltage of the first node N1. Optionally, when the tenth transistor T10 is turned on, the voltage of the second power supply VGL is provided to the output terminal TM4, which (annotated as Out(n) in FIG. 1) may be provided to a n-th gate line and used as a gate driving signal having a gate-off level. In one example, when the gate driving signal has a gate-off level, it may be understood that the gate driving signal is not provided.

In some embodiments, the input subcircuit ISC is configured to control the voltages of the first node N1 and a fifth node N5 in response to signals provided to the first input terminal TM1 and the second input terminal TM2, respectively. Optionally, the input subcircuit ISC includes a first transistor T1.

The first transistor T1 is coupled between the first input terminal TM1 and the fifth node N5. A gate electrode of the first transistor T1 is coupled to the second input terminal TM2. When the first clock signal CK is provided to the second input terminal TM2, the first transistor T1 is turned on to electrically couple the first input terminal TM1 with the fifth node N5.

In some embodiments, the first processing subcircuit PSC1 is configured to control the voltage of the fourth node N4 in response to the voltages of the first node N1 and the fifth node N5. Optionally, the first processing subcircuit PSC1 includes an eighth transistor T8, a thirteenth transistor T13, and a second capacitor C2.

The eighth transistor T8 is coupled between the first power supply VGH and the fourth node N4. A gate electrode of the eighth transistor T8 is coupled to the fifth node N5. The eighth transistor T8 may be turned on or off depending on the voltage of the fifth node N5. Optionally, when the eighth transistor T8 is turned on, the voltage of the first power supply VGH may be provided to the fourth node N4.

The thirteenth transistor T13 is coupled between the first power supply VGH and the fifth node N5. A gate electrode of the thirteenth transistor T13 is coupled to a signal NCX. The thirteenth transistor T13 may be turned on or off depending on the voltage of the signal NCX. Optionally, when the thirteenth transistor T13 is turned on, the voltage of the first power supply VGH may be provided to the fifth node N5.

The second capacitor C2 is coupled between the first power supply VGH and the fourth node N4. Optionally, the second capacitor C2 is configured to charge a voltage to be applied to the fourth node N4. Optionally, the second capacitor C2 is configured to stably maintain the voltage of the fourth node N4.

In some embodiments, the second processing subcircuit PSC2 is coupled to a sixth node N6, and is configured to control the voltage of the fourth node N4 in response to a signal input to the third input terminal TM3. Optionally, the second processing subcircuit PSC2 includes a sixth transistor T6, a seventh transistor T7, and a first capacitor C1.

A first terminal of the first capacitor C1 is coupled to the sixth node N6, and a second terminal of the first capacitor C1 is coupled to a third node N3 that is a common node between the sixth transistor T6 and the seventh transistor T7.

The sixth transistor T6 is coupled between the third node N3 and the third input terminal TM3. A gate electrode of the sixth transistor T6 is coupled to the sixth node N6. The sixth transistor T6 may be turned on depending on the voltage of the sixth node N6 so that a voltage corresponding to the second clock signal CB provided to the third input terminal TM3 may be applied to the third node N3.

The seventh transistor T7 is coupled between the fourth node N4 and the third node N3. A gate electrode of the seventh transistor T7 is coupled to the third input terminal TM3. The seventh transistor T7 may be turned on in response to the second clock signal CB provided to the third input terminal TM3, and thus, applies the voltage of the first power supply VGH to the third node N3.

In some embodiments, the third processing subcircuit PSC3 is configured to control the voltage of the second node N2. Optionally, the third processing subcircuit PSC3 includes a second transistor T2, a third transistor T3, a fourth transistor T4, a fifth transistor T5, and a third capacitor C3.

A first electrode of the third capacitor C3 is coupled to the first node N1, and a second electrode of the third capacitor C3 is coupled to a seventh node N7 that is a common node between the fourth transistor T4 and the fifth transistor T5.

The fifth transistor T5 is coupled between the first power supply VGH and the seventh node N7. A gate electrode of the fifth transistor T5 is coupled to the second node N2. The fifth transistor T5 may be turned on or off depending on the voltage of the second node N2.

The fourth transistor T4 is coupled between the seventh node N7 and the third input terminal TM3. A gate electrode of the fourth transistor T4 is coupled to the first node N1. The fourth transistor T4 may be turned on or off depending on the voltage of the first node N1.

The second transistor T2 is coupled between the second node N2 and the second input terminal TM2. A gate electrode of the second transistor T2 is coupled to the fifth node N5.

The third transistor T3 is coupled between the second node N2 and the second power supply VGL. A gate electrode of the third transistor T3 is coupled to the second input terminal TM2. When the first clock signal CK is provided to the second input terminal TM2, the third transistor T3 may be turned on so that the voltage of the second power supply VGL may be provided to the second node N2.

In some embodiments, the first stabilizing subcircuit SSC1 is coupled between the second processing subcircuit PSC2 and the third processing subcircuit PSC3. Optionally, the first stabilizing subcircuit SSC1 is configured to limit a voltage drop width of the second node N2. Optionally, the first stabilizing subcircuit SSC1 includes an eleventh transistor T11.

The eleventh transistor T11 is coupled between the second node N2 and the sixth node N6. A gate electrode of the eleventh transistor T11 is coupled to the second power supply VGL. Since the second power supply VGL has a gate-on level voltage, the eleventh transistor T11 may always remain turned on. Therefore, the second node N2 and the sixth node N6 may be maintained at the same voltage, and operated as substantially the same node.

In some embodiments, the second stabilizing subcircuit SSC2 is coupled between the first node N1 and the fifth node N5. Optionally, the second stabilizing subcircuit SSC2 is configured to limit a voltage drop width of the first node N1. Optionally, the second stabilizing subcircuit SSC2 includes a twelfth transistor T12.

The twelfth transistor T12 is coupled between the first node N1 and the fifth node N5. A gate electrode of the twelfth transistor T12 is coupled to the second power supply VGL. Since the second power supply VGL has a gate-on level voltage, the twelfth transistor T12 may always remain turned on. Therefore, the first node N1 and the fifth node N5 may be maintained at the same voltage, and operated as substantially the same node.

In some embodiments, each of the first to twelfth transistors T1 to T12 may be formed of a p-type transistor. In some embodiments, the gate-on voltage of the first to twelfth transistors T1 to T12 may be set to a low level, and the gate-off voltage thereof may be set to a high level.

Figure 2A:
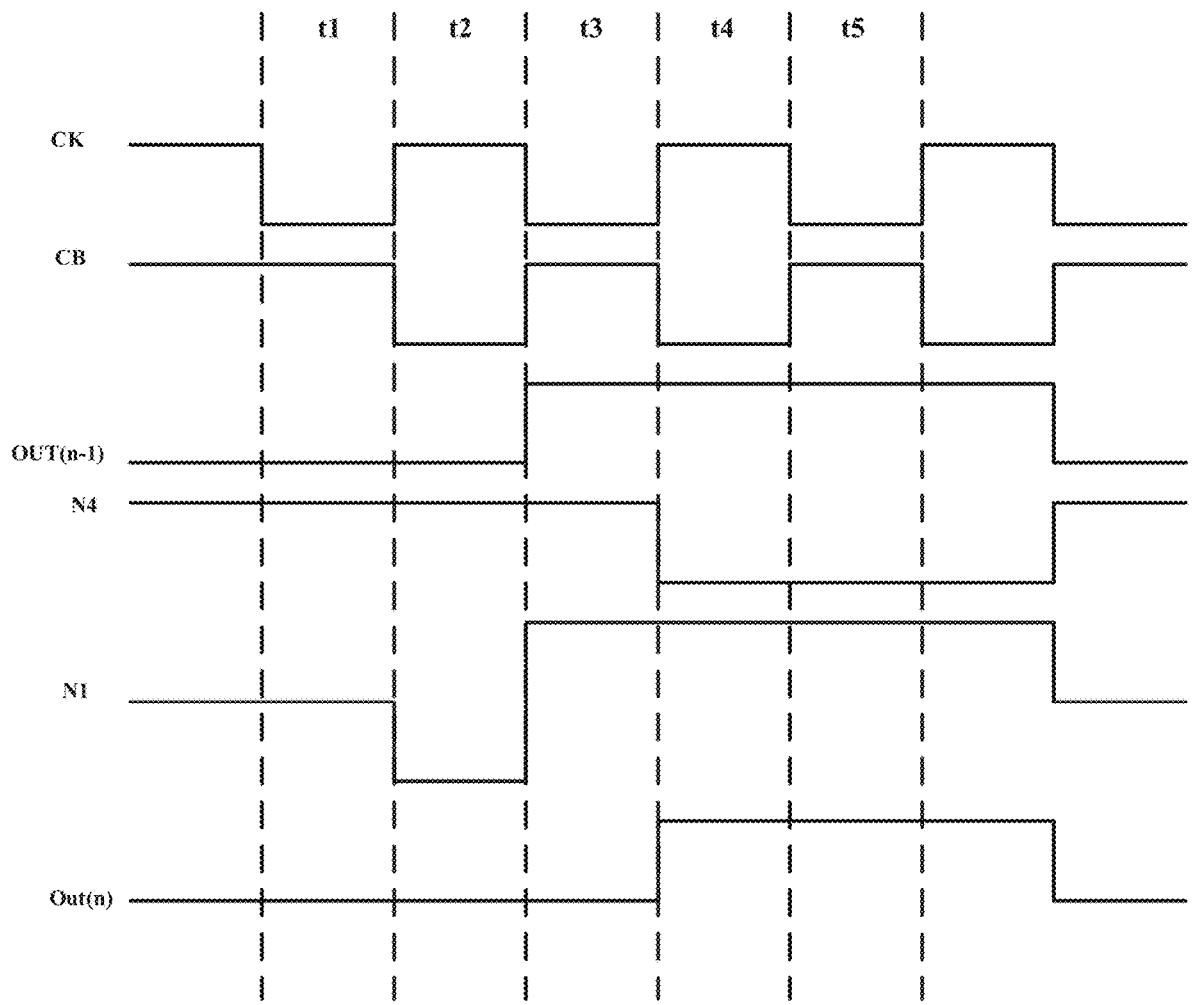
FIG. 2A is a timing diagram illustrating an operation of the stage illustrated in FIG. 1.

FIG. 2A is a timing diagram illustrating an operation of the stage illustrated in FIG. 1. Referring to FIG. 2A, the first clock signal CK and the second clock signal CB each may have a cycle of two horizontal periods (2H), and have a gate-on level during different horizontal periods. Optionally, the second clock signal CB may be set to a signal shifted by a half cycle (i.e., one horizontal period (1H)) from the first clock signal CK.

In some embodiments, when the clock signals CK and CB are provided, the second input terminal TM2 and the third input terminal TM3 may be set to the low level, i.e., the voltage of the second power supply VGL. When the clock signals CK and CB are not provided, the second input terminal TM2 and the third input terminal TM3 may be set to the high level, i.e., the voltage of the first power supply VGH.

In some embodiments, when a start signal STV or an output signal Out(n−1) from a (n−1)-th stage output terminal is provided, the first input terminal TM1 may be set to the high level, i.e., the voltage of the first power supply VGH. When the start signal STV or the output signal Out(n−1) from a (n−1)-th stage output terminalis not provided, the first input terminal TM1 may be set to the low level, i.e., the voltage of the second power supply VGL.

In some embodiments, the start signal STV or the output signal Out(n−1) from a (n−1)-th stage output terminal to be provided to the first input terminal TM1 may be set to overlap at least once with the first clock signal CK to be provided to the second input terminal TM2. Optionally, the start signal STV or the output signal Out(n−1) from a (n−1)-th stage output terminal may have a width greater than that of the first clock signal CK and, for example, be provided during four horizontal periods (4H). In this case, an output signal to be provided to the first input terminal TM1 of the next stage may also overlap at least once with the second clock signal CB to be provided to the second input terminal TM2 of the next stage.

In some embodiments, during a first period t1, the first clock signal CK is provided to the second input terminal TM2. The first is transistor T1 and the fifth transistor T5 are turned on. Furthermore, during the first period t1, the second clock signal CB is not provided to the third input terminal TM3, the seventh transistor T7 is turned off.

In some embodiments, when the first transistor T1 is turned on, the first input terminal TM1 and the fifth node N5 are electrically coupled to each other. The twelfth transistor T12 remains turned on, the first input terminal TM1 is electrically coupled with the first node N1 via the fifth node N5.

In some embodiments, during the first period t1, the start signal STV or the output signal Out(n−1) from a (n−1)-th stage output terminal to be provided to the first input terminal TM1 has the low level, a low voltage (e.g., the voltage of the second power supply VGL) may be applied to the fifth node N5 and the first node N1. When the fifth node N5 and the first node N1 are set to the low voltage, the third transistor T3, the fourth transistor T4, the eighth transistor T8, and the tenth transistor T10 are turned on.

In some embodiments, when the fourth transistor T4 is turned on, the third input terminal TM3 and the seventh node N7 are electrically coupled to each other. The second clock signal CB is not provided to the third input terminal TM3 during the first period t1, a high voltage may be provided to the seventh node N7. The third capacitor C3 is configured to charge a voltage corresponding to the turned-on state of the third transistor T3.

In some embodiments, when the fourth transistor T4 is turned on, the fifth transistor T5 is connected in the form of a diode between the second node N2 and the second power supply VGL. When the fifth transistor T5 is turned on during the first period t1, the voltage of the second power supply VGL is not transmitted to the second node N2, and the voltage of the second node N2 is maintained at the voltage of the preceding state, e.g., the high voltage. The eleventh transistor T11 remains turned on, the high voltage of the second node N2 is applied to the sixth node N6, and the sixth node N6 is set to the high voltage. The second transistor T2 and the sixth transistor T6 are turned off.

In some embodiments, when the eighth transistor T8 is turned on, the voltage of the first power supply VGH is provided to the fourth node N4. The ninth transistor T9 is turned off.

In some embodiments, when the tenth transistor T10 is turned on, the voltage of the second power supply VGL is provided to the output terminal TM4. During the first period t1, the gate driving signal are not provided to the n-th stage gate line.

In some embodiments, during a second period t2, the supply of the first clock signal CK to the second input terminal TM2 is interrupted. The first transistor T1 and the fifth transistor T5 are turned off. The fourth node N4 and the first node N1 maintain the voltages of the preceding period by the second capacitor C2 and the third capacitor C3. Since the fourth node N4 remains in the high voltage state, the ninth transistor T9 remains turned off. Since the first node N1 remains in the low voltage state, the third transistor T3, the fourth transistor T4, the eighth transistor T8, and the tenth transistor T10 remain turned on.

In some embodiments, during the second period t2, the second clock signal CB is provided to the third input terminal TM3. The seventh transistor T7 is turned on by the second clock signal CB provided to the third input terminal TM3. When the seventh transistor T7 is turned on, the fourth node N4 and the third node N3 are electrically coupled to each other. The third node N3 is set to the high voltage.

In some embodiments, during the second period t2, the second clock signal CB is provided to the seventh node N7 via the fourth transistor T4 that is turned on. A low voltage is provided to the seventh node N7. The voltage of the first node N1 is maintained at a voltage (a 2-step low voltage) less than the voltage of the second power supply VGL by coupling of the third capacitor C3.

In some embodiments, during a third period t3, the supply of the second clock signal CB to the third input terminal TM3 is interrupted. When the supply of the second clock signal CB is interrupted, the seventh transistor T7 is turned off.

In some embodiments, during the third period t3, the start signal STV or the output signal Out(n−1) from a (n−1)-th stage output terminal is provided to the first input terminal TM1, and the first clock signal CK is provided to the second input terminal TM2. When the first clock signal CK is provided to the second input terminal TM2, the first transistor T1 and the fifth transistor T5 are turned on.

In some embodiments, when the first transistor T1 is turned on, the first input terminal TM1 and the fifth node N5 are electrically coupled to each other. The twelfth transistor T12 remains turned on, the first input terminal TM1 is electrically coupled with the first node N1 via the fifth node N5. The fifth node N5 and the first node N1 are set to the high voltage by the start signal STV or the output signal Out(n−1) from a (n−1)-th stage output terminal that is provided to the first input terminal TM1. When the fifth node N5 and the first node N1 are set to the high voltage, the third transistor T3, the fourth transistor T4, the eighth transistor T8, and the tenth transistor T10 are turned off.

In some embodiments, when the fifth transistor T5 is turned on, the low voltage of the second power supply VGL is applied to the second node N2 so that the second node N2 and the sixth node N6 are set to the low voltage. The second transistor T2 and the sixth transistor T6 may be turned on.

In some embodiments, when the second transistor T2 is turned on, the voltage of the first power supply VGH is applied to the seventh node N7. The seventh node N7 is maintained at the high voltage. Since the third transistor T3 remains turned off, the voltage of the second clock signal CB to be applied to the third input terminal TM3 is not transmitted to the seventh node N7. Since both the seventh node N7 and the first node N1 that are the opposite ends of the third capacitor C3 are maintained at the high voltage, the third capacitor C3 is not charged or discharged. A current path is formed from the first power supply VGH to the first node N1 via the second transistor T2, and the high voltage of the first power supply VGH is transmitted to the first node N1. The voltage of the first node N1 is stably maintained at the high level.

In some embodiments, when the sixth transistor T6 is turned on, the third input terminal TM3 and the third node N3 are electrically coupled to each other. Since the second clock signal CB is not provided to the third input terminal TM3 during the third period t3, the third node N3 is maintained at the high voltage. Since the seventh transistor T7 remains turned off, the voltage of the third node N3 does not affect the voltage of the fourth node N4. The first capacitor C1 is configured to store a voltage corresponding to the turn-on level of the sixth transistor T6.

In some embodiments, during a fourth period t4, the second clock signal CB may be provided to the third input terminal TM3. When the second clock signal CB is provided to the third input terminal TM3, the seventh transistor T7 is turned on.

In some embodiments, when the seventh transistor T7 is turned on, the fourth node N4 and the third node N3 are electrically coupled to each other. The low voltage of the second clock signal CB that is provided to the third input terminal TM3 via the sixth transistor T6 that remains turned on is provided to the third node N3 and the fourth node N4. When the low voltage is provided to the fourth node N4, the ninth transistor T9 is turned on.

In some embodiments, when the ninth transistor T9 is turned on, the voltage of the first power supply VGH is provided to the output terminal TM4. The voltage of the first power supply VGH that is provided to the output terminal TM4 is provided to the n-th stage gate line as the gate driving signal.

In some embodiments, during a fifth period t5, the supply of the second clock signal CB to the third input terminal TM3 is interrupted. When the supply of the second clock signal CB is interrupted, the seventh transistor T7 is turned off. The fourth node N4 is stably maintained at the high voltage by the second capacitor C2. The ninth transistor T9 remains turned on, and the voltage of the first power supply VGH is provided to the n-th stage gate line as the gate driving signal.

Although the supply of the second clock signal CB is interrupted during the fifth period t5, the third transistor T3 remains turned off and, therefore, the voltage of the second clock signal CB is not provided to the seventh node N7 and does not affect the voltage of the first node N1.

As described above, in some embodiments, during the supply of the gate driving signal, the third transistor T3 that remains turned off prevents a change in voltage of the second clock signal CB from affecting the first node N1, whereby the first node N1 may be stably maintained at the high voltage. Furthermore, in some embodiments, during the supply of the gate driving signal, the third capacitor C3 is prevented from being charged or discharged. The third capacitor C3 does not perform a charging or discharging operation at any time other than when the voltage of the first node N1 is set to the low level is by the coupling of the third capacitor C3. Therefore, in some embodiments, during the supply of the gate driving signal, the third capacitor C3 does not act as a load. Consequently, the power consumption may be reduced, and reliable output of the gate driving signal may be secured.

Figure 2B:
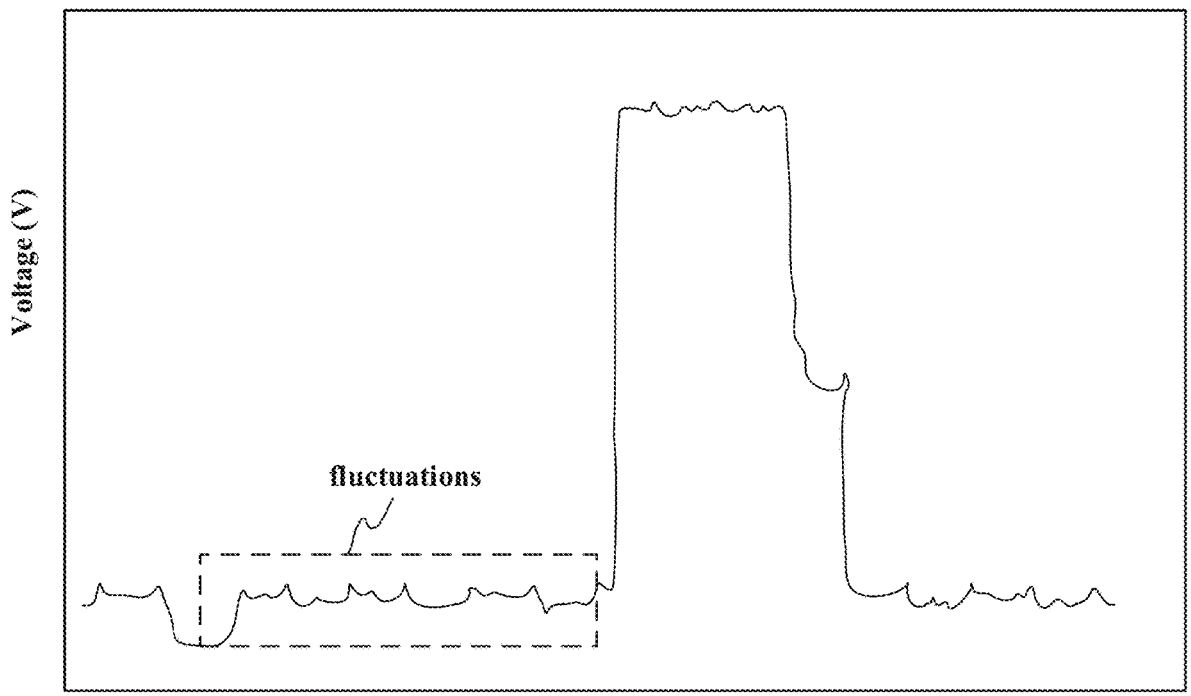
FIG. 2B shows an example of fluctuations in an output signal from the scan circuit.

The inventors of the present disclosure discover that output signals from the scan circuit are prone to small fluctuations (for example, in a range of 1 V), which results in jittering of gate driving signals that adversely affects display quality. FIG. 2B shows an example of fluctuations in an output signal from the scan circuit. Surprisingly and unexpectedly, the inventors of the present disclosure discover that, by adopting intricate layout structures for the first capacitor C1 and the sixth transistor T6, the fluctuations in the gate driving signals can be significantly reduced or eliminated. The inventors of the present disclosure discover that coupling fluctuation between the first clock signal CK and the second clock signal CB is prone to occur through a channel including the second transistor T2, the second node N2, the eleventh transistor T11, the first capacitor C1 and the sixth transistor T6, particularly when the second transistor T2 is turned on. The unique structures adopted for the first capacitor C1 and the sixth transistor T6 according to the present disclosure effectively reduce or eliminate the coupling fluctuation between the first clock signal CK and the second clock signal CB.

The inventors of the present disclosure further discover that a synergistic effect in suppressing the fluctuations in the gate driving signals can be achieved by further adopting intricate layout structures for the ninth transistor T9 and/or the tenth transistor T10. The inventors of the present disclosure discover that coupling fluctuation between voltage signals (gate driving signals) at the output terminal TM4 and the first clock signal CK, and/or between voltage signals at the output terminal TM4 and the second clock signal CB, further contributes to the fluctuations in the gate driving signals. The unique structures adopted for the ninth transistor T9 and/or the tenth transistor T10 according to the present disclosure effectively reduce or eliminate the coupling fluctuation between voltage signals at the output terminal TM4 and the first clock signal CK, and/or between voltage signals at the output terminal TM4 and the second clock signal CB, which in turn further suppress the fluctuations in the gate driving signals.

Figure 2C:
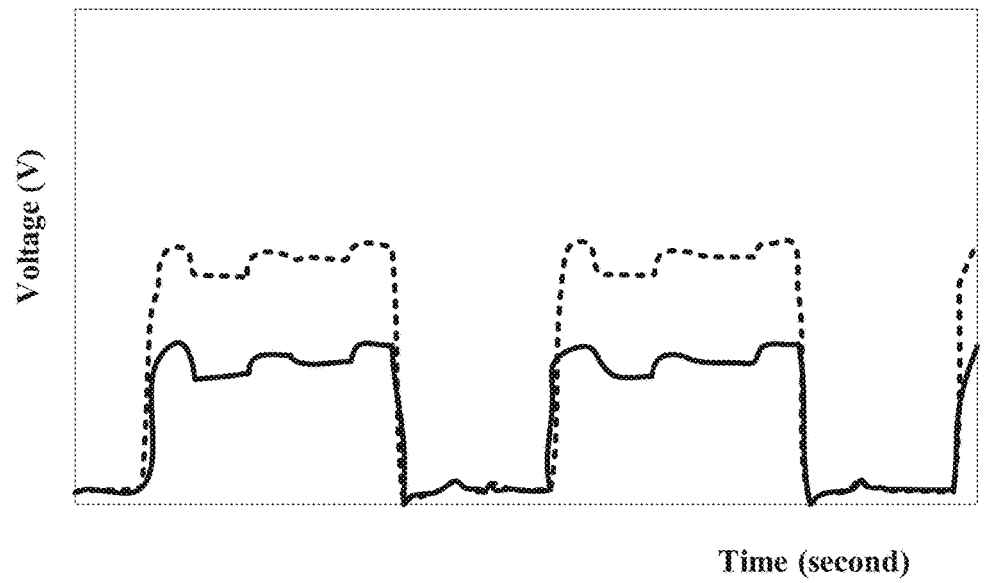
FIG. 2C is a comparison between a portion of an output signal from a scan circuit according to the present disclosure and a portion of an output signal from a related scan circuit.

Moreover, the inventors of the present disclosure further discover that a reduction in parasitic capacitance between an input signal line connected to the first input terminal TM1 (e.g., a start signal line or a signal line connecting an output terminal of a preceding stage to the first input terminal TM1) and the first node N1 can additionally reduce the fluctuations in the gate driving signals. FIG. 2C is a comparison between a portion of an output signal from a scan circuit according to the present disclosure and a portion of an output signal from a related scan circuit. As shown in FIG. 2C, the fluctuations in the output signal from the scan circuit according to the present disclosure (solid lines) are significantly smaller in amplitude as compared to the fluctuations in the output signal from the related scan circuit (dotted lines), for example, reduced by at least 20%, at least 30%, at least 40%, or at least 50%.

Figure 3:
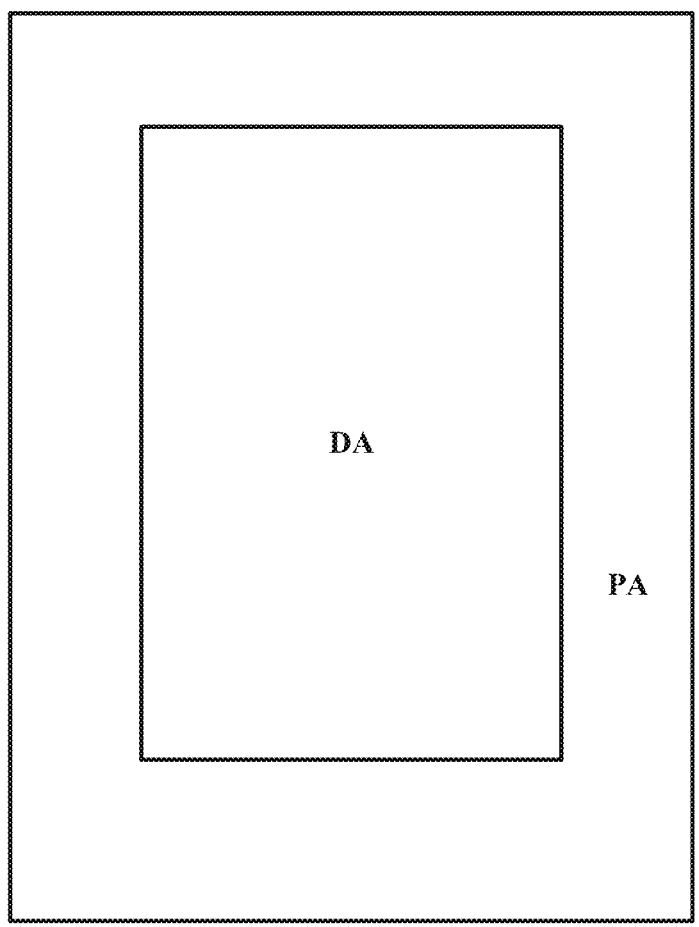
FIG. 3 is a schematic diagram illustrating a display area and a peripheral area in a display panel in some embodiments according to the present disclosure.

FIG. 3 is a schematic diagram illustrating a display area and a peripheral area in a display panel in some embodiments according to the present disclosure. Referring to FIG. 3, in some embodiments, the display apparatus includes a display area DA and a peripheral area PA. As used herein, the term "display area" refers to an area of a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

The scan circuit in some embodiments is in the peripheral area. As used herein the term "peripheral area" refers to an area of a display panel where various circuits (for example, the scan circuit) and wires are provided to transmit signals to the display panel. To increase the transparency of the display panel, non-transparent or opaque components of the display panel (e.g., battery, printed circuit board, metal frame), can be disposed in the peripheral area rather than in the display areas.

Figure 4A:
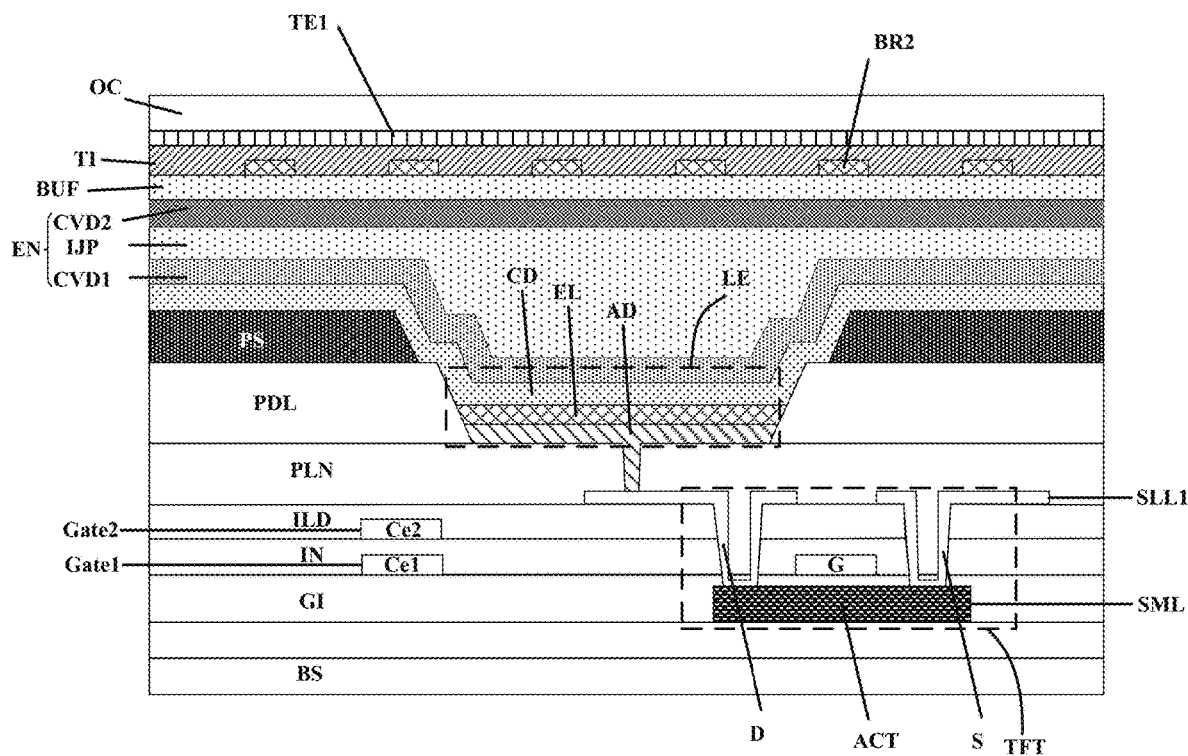
FIG. 4A illustrates a detailed structure in a display region in a display panel in some embodiments according to the present disclosure.

Various implementations of the present display panel may be practiced. FIG. 4A illustrates a detailed structure in a display region in a display panel in some embodiments according to the present disclosure. Referring to FIG. 4A, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a planarization layer PLN on a side of the first electrode S and the second electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Referring to FIG. 4A, the display panel includes a semiconductor material layer SML, a first conductive layer Gate1, a second conductive layer Gate2, and a first signal line layer SLL1. The display panel further includes an insulating layer IN between the first conductive layer Gate 1 and the second conductive layer Gate2; and an inter-layer dielectric layer ILD between the second conductive layer Gate2 and the first signal line layer SLL1.

Figure 4B:
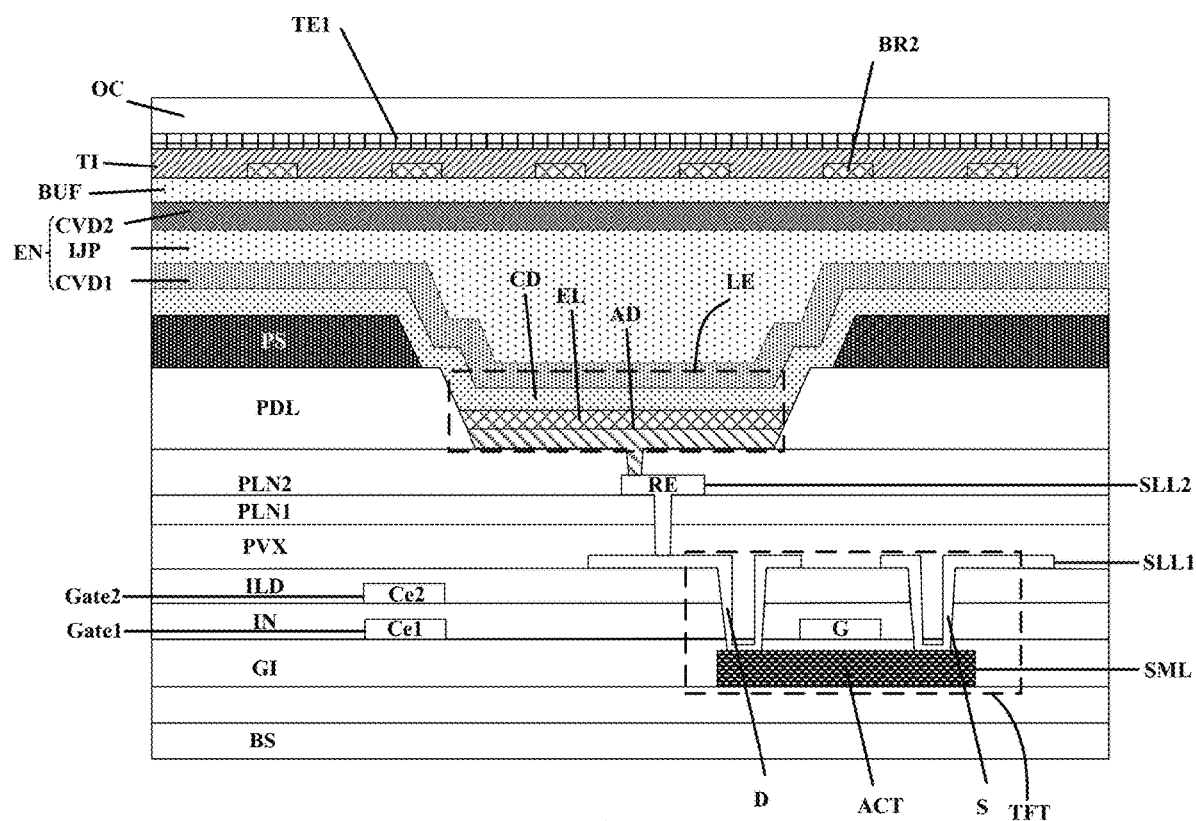
FIG. 4B illustrates a detailed structure in a display region in a display panel in some embodiments according to the present disclosure.

FIG. 4B illustrates a detailed structure in a display region in a display panel in some embodiments according to the present disclosure. Referring to FIG. 4B, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a passivation layer PVX on a side of the first electrode S and the second electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the display region does not include the passivation layer PVX. e.g., the inter-layer dielectric layer ILD is in direct contact with the first planarization layer PLN1.

Referring to FIG. 4B, the display panel includes a semiconductor material layer SML, a first conductive layer Gate1, a second conductive layer Gate2, a first signal line layer SLL1, and a second signal line layer SLL2. The display panel further includes an insulating layer IN between the first conductive layer Gate1 and the second conductive layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

Figure 4C:
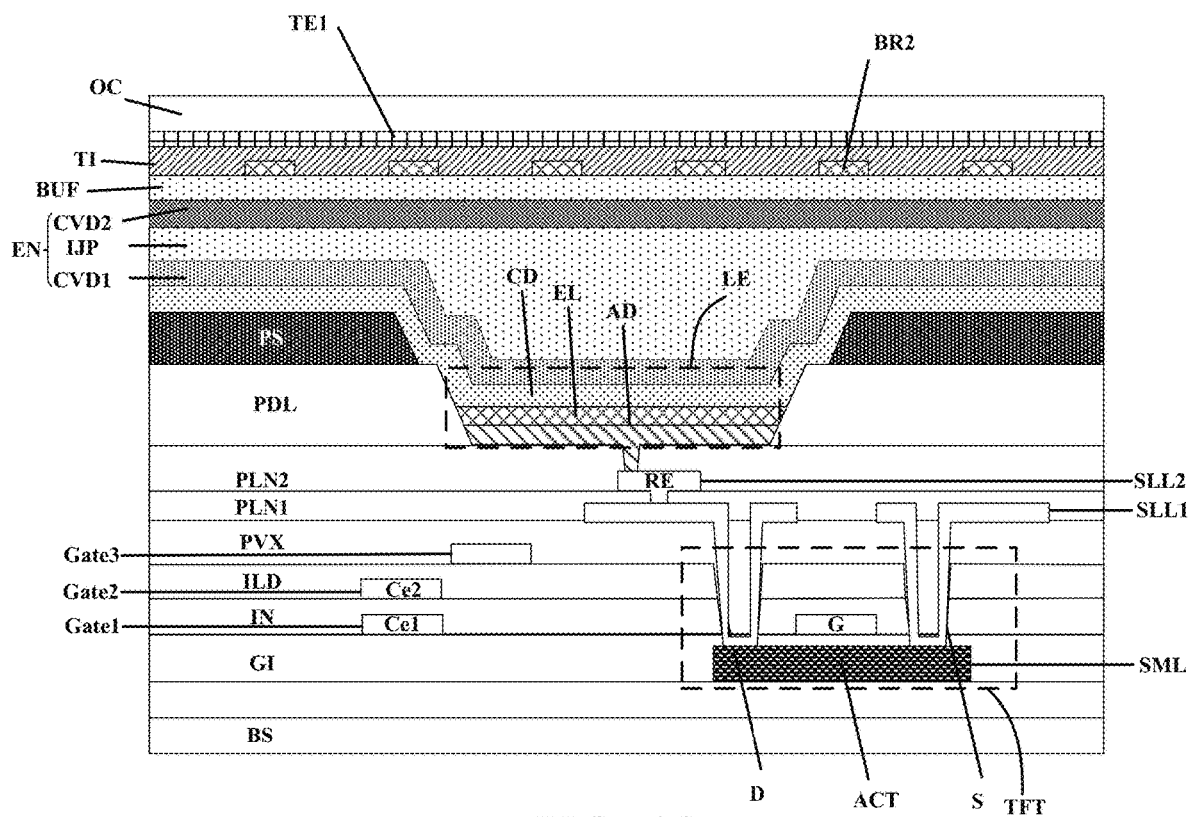
FIG. 4C illustrates a detailed structure in a display region in a display panel in some embodiments according to the present disclosure.

FIG. 4C illustrates a detailed structure in a display region in a display panel in some embodiments according to the present disclosure. Referring to FIG. 4C, the display panel in some embodiments further includes a third conductive layer Gate3 on a side of the inter-layer dielectric layer ILD away from the insulating layer IN. The second electrode D and the first electrode S are on a side of the passivation layer PVX away from the inter-layer dielectric layer ILD.

Referring to FIG. 4C, the display panel includes a semiconductor material layer SML, a first conductive layer Gate1, a second conductive layer Gate2, a third conductive layer Gate3, a first signal line layer SLL1, and a second signal line layer SLL2. The display panel further includes an insulating layer IN between the first conductive layer Gate1 and the second conductive layer Gate2; an inter-layer dielectric layer ILD between the second conductive layer Gate2 and the third conductive layer Gate3; a passivation layer PVX between the third conductive layer Gate3 and the first signal line layer SLL1; a first planarization layer PLN1 between the first signal line layer SLL1 and the second signal line layer SLL2.

Figure 5A:
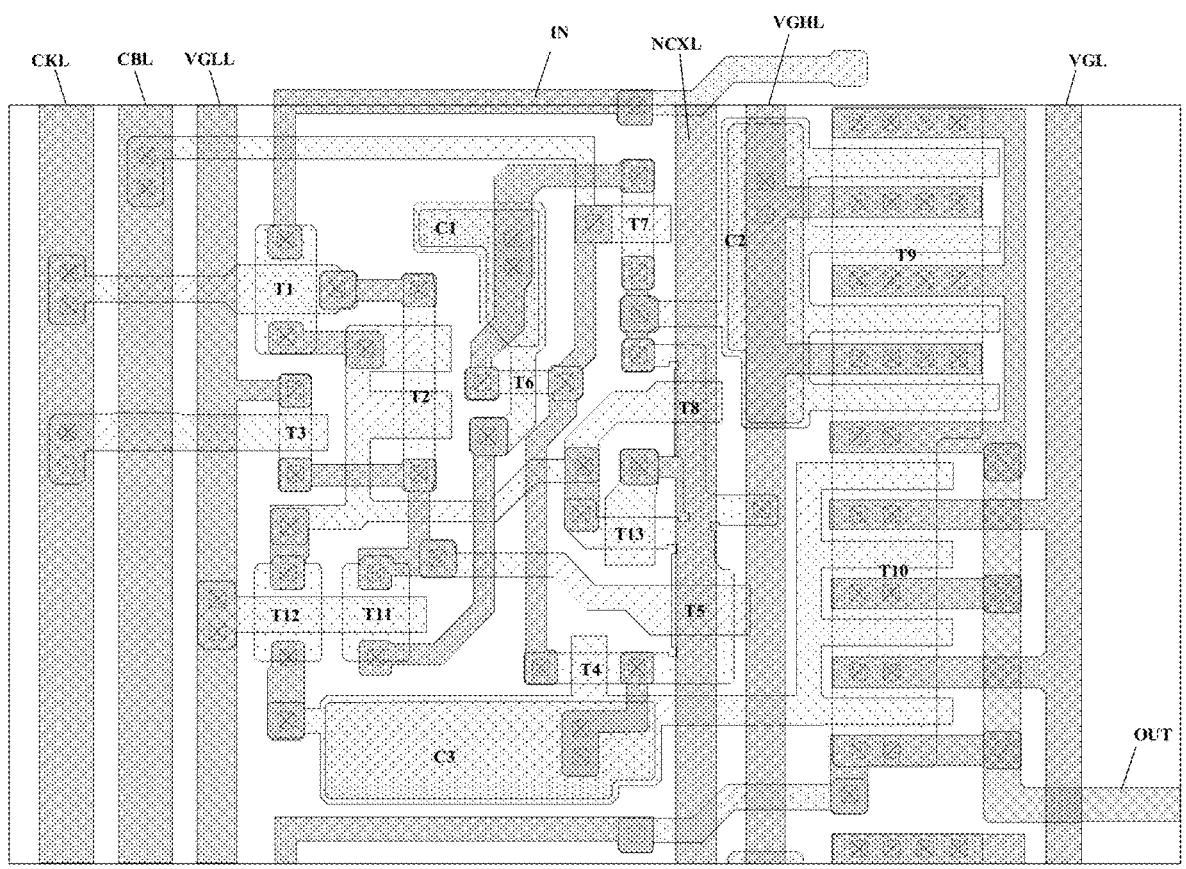
FIG. 5A illustrates the structure of a n-th stage of scan circuit in some embodiments according to the present disclosure.
Figure 5B:
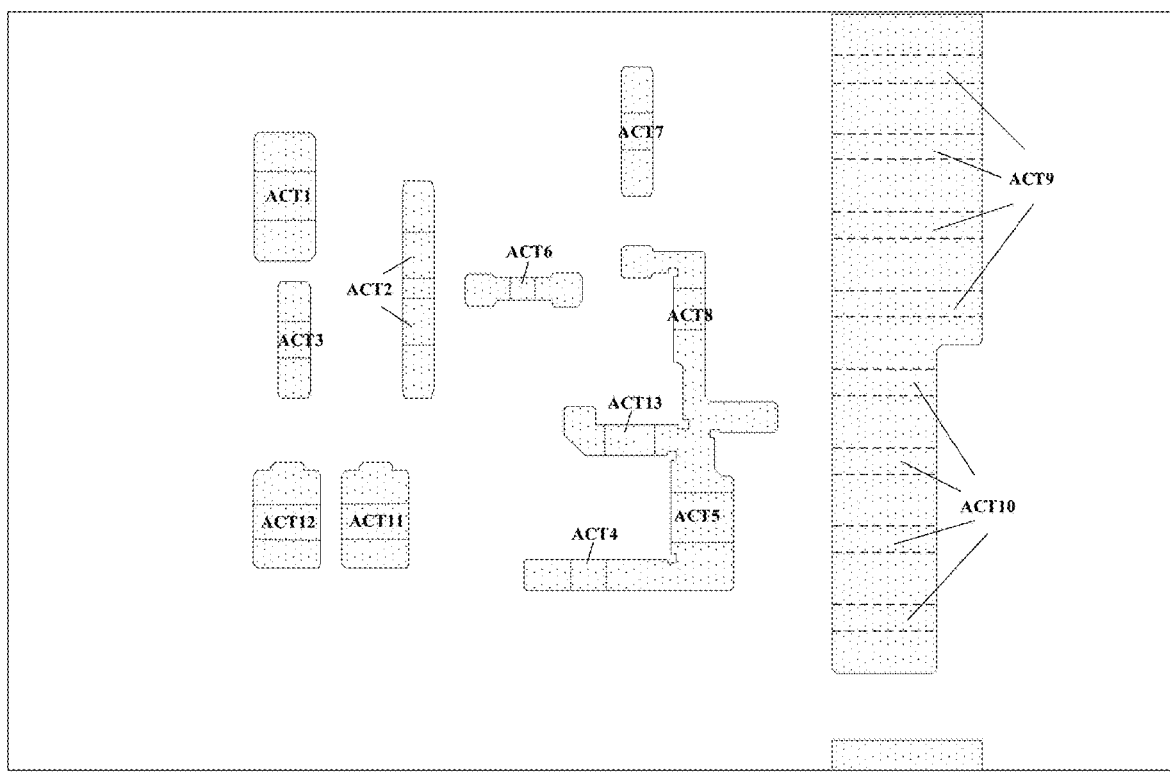
FIG. 5B illustrates the structure of a semiconductor material layer in the scan circuit depicted in FIG. 5A.

FIG. 5A illustrates the structure of a n-th stage of scan circuit in some embodiments according to the present disclosure. The positions of the transistors TI to T13, and the capacitors C1 to C3 are annotated in FIG. 5A. FIG. 5B illustrates the structure of a semiconductor material layer in the scan circuit depicted in FIG. 5A. Referring to FIG. 5B, the semiconductor material layer (e.g., corresponding to SML in FIG. 4A to FIG. 4C) includes active layers of the transistors in the scan circuit. Active layers of the transistors are annotated in FIG. 5B. Referring to FIG. 5A and FIG. 5B, in some embodiments, the active layer ACT1 of the first transistor T1, the active layer ACT2 of the second transistor T2, the active layer ACT3 of the third transistor T3, the active layer ACT4 of the fourth transistor T4, the active layer ACT5 of the fifth transistor T5, the active layer ACT6 of the sixth transistor T6, the active layer ACT7 of the seventh transistor T7, the active layer ACT8 of the eighth transistor T8, the active layer ACT9 of the ninth transistor T9, the active layer ACT10 of the tenth transistor T10, the active layer ACT11 of the eleventh transistor T11, the active layer ACT12 of the twelfth transistor T12, and the active layer ACT13 of the thirteenth transistor T13, are in a same layer. In one example, the second transistor T2 is a double gate transistor, and the active layer ACT2 of the second transistor T2 includes two portions spaced apart from each other, as depicted in FIG. 5B. In another example, the ninth transistor T9 is a multi-gate transistor, and the active layer ACT9 of the ninth transistor T9 includes multiple portion spaced apart from each other, as depicted in FIG. 5B. In another example, the tenth transistor T10 is a multi-gate transistor, and the active layer ACT10 of the tenth transistor T10 includes multiple portion spaced apart from each other, as depicted in FIG. 5B.

As used herein, the term "same layer" refers to the relationship between the layers simultaneously formed in the same step. In one example, the active layers of transistors are in a same layer when they are formed as a result of one or more steps of a same patterning process performed in a same layer of material. In another example, the active layers can be formed in a same layer by simultaneously performing the step of forming a first active layer, and the step of forming a second active layer. The term "same layer" does not always mean that the thickness of the layer or the height of the layer in a cross-sectional view is the same.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer. In the context of a double-gate type transistor (for example, the second transistor T2), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Figure 5C:
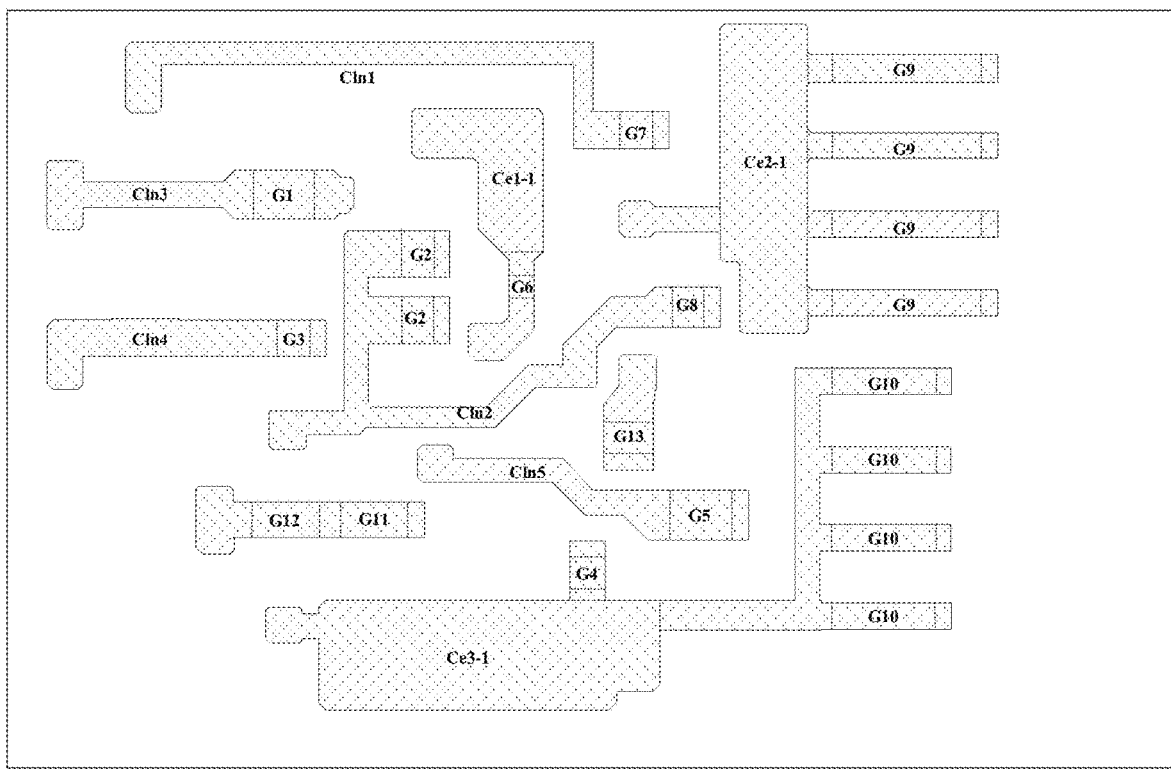
FIG. 5C illustrates the structure of a first conductive layer in the scan circuit depicted in FIG. 5A.

FIG. 5C illustrates the structure of a first conductive layer in the scan circuit depicted in FIG. 5A. Referring to FIG. 5C, the first conductive layer (e.g., corresponding to Gate1 in FIG. 4A to FIG. 4C) in some embodiments includes gate electrodes of transistor in the scan circuit. Gate electrodes of the transistors are annotated in FIG. 5C. Referring to FIG. 5A and FIG. 5C, in some embodiments, the gate electrode GI of the first transistor T1, the gate electrode G2 of the second transistor T2, the gate electrode G3 of the third transistor T3, the gate electrode G4 of the fourth transistor T4, the gate electrode G5 of the fifth transistor T5, the gate electrode G6 of the sixth transistor T6, the gate electrode G7 of the seventh transistor T7, the gate electrode G5 of the eighth transistor T8, the gate electrode G9 of the ninth transistor T9, the gate electrode G10 of the tenth transistor T10, the gate electrode G11 of the eleventh transistor T11, the gate electrode G12 of the twelfth transistor T12, and the gate electrode G13 of the thirteenth transistor T13, are in a same layer. In one example, the second transistor T2 is a double gate transistor, and the gate electrode G2 of the second transistor T2 includes two portions spaced apart from each other, as depicted in FIG. 5B. In another example, the ninth transistor T9 is a multi-gate transistor, and the gate electrode G9 of the ninth transistor T9 includes multiple portion spaced apart from each other, as depicted in FIG. 5B. In another example, the tenth transistor T10 is a multi-gate transistor, and the gate electrode G10 of the tenth transistor T10 includes multiple portion spaced apart from each other, as depicted in FIG. 5B. Optionally, the gate electrode G11 of the eleventh transistor T11 and the gate electrode G12 of the twelfth transistor T12 are parts of a unitary structure.

In some embodiments, the first conductive layer further includes first capacitor electrodes of capacitors in the scan circuit. First capacitor electrodes of capacitors are annotated in FIG. 5C. Referring to FIG. 5A and FIG. 5C, in some embodiments, a first capacitor electrode Ce1-1 of the first capacitor C1, a first capacitor electrode Ce2-1 of the second capacitor C2, a first capacitor electrode Ce3-1 of the third capacitor C3, are in a same layer. Optionally, the first capacitor electrode Ce1-1 of the first capacitor C1 and the gate electrode G6 of the sixth transistor T6 are parts of a unitary structure. Optionally, the first capacitor electrode Ce2-1 of the second capacitor C2, the gate electrode G9 of the ninth transistor T9 are parts of a unitary structure. Optionally, the first capacitor electrode Ce3-1 of the third capacitor C3, the gate electrode G4 of the fourth transistor T4, and the gate electrode G10 of the tenth transistor T10, are parts of a unitary structure.

Figure 5D:
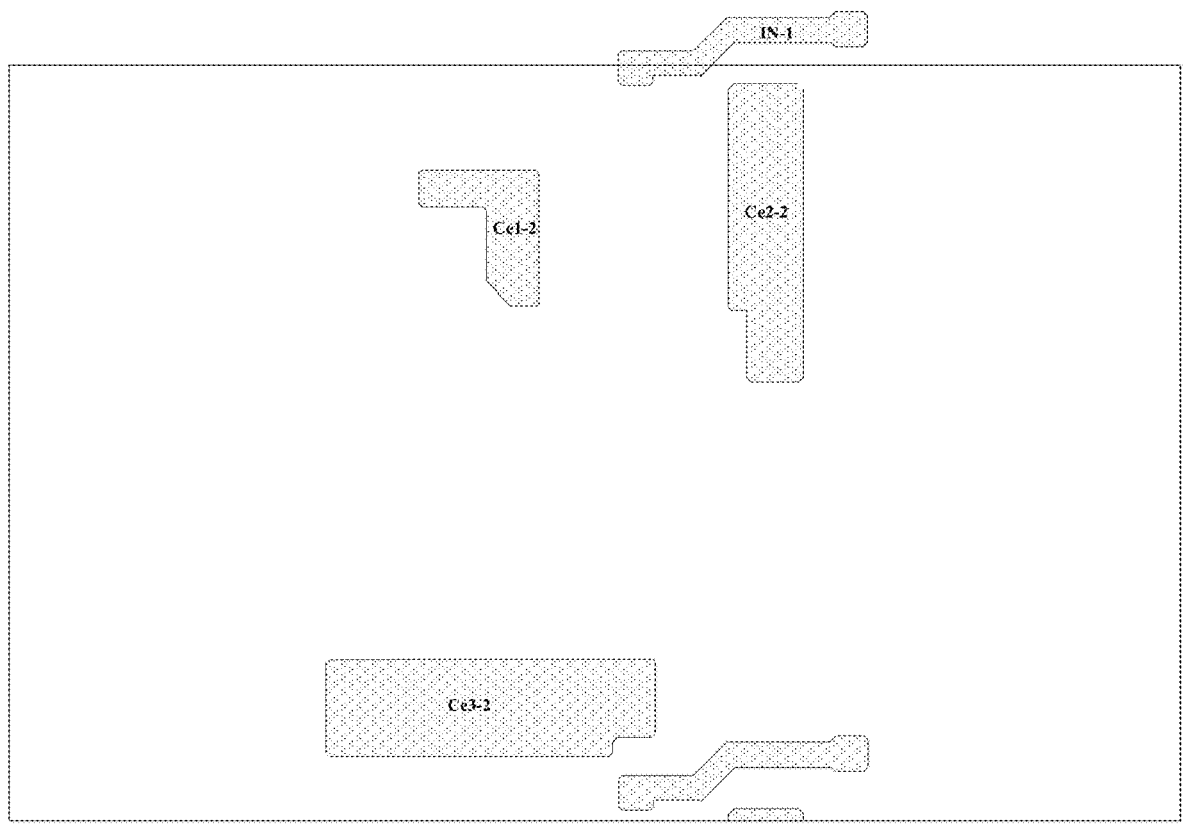
FIG. 5D illustrates the structure of a second conductive layer in the scan circuit depicted in FIG. 5A.

FIG. 5D illustrates the structure of a second conductive layer in the scan circuit depicted in FIG. 5A. Referring to FIG. 5D, the second conductive layer (e.g., corresponding to Gate2 in FIG. 4A to FIG. 4C) includes second capacitor electrodes of capacitors in the scan circuit. Second capacitor electrodes of capacitors are annotated in FIG. 5D. Referring to FIG. 5A and FIG. 5D, in some embodiments, a second capacitor electrode Ce1-2 of the first capacitor C1, a second capacitor electrode Ce2-2 of the second capacitor C2, a second capacitor electrode Ce3-2 of the third capacitor C3, are in a same layer. The second conductive layer in some embodiments further includes a first line portion IN-1 of an input signal line (annotated as IN in FIG. 5A). The input signal line is a signal line electrically connected to a first electrode of the first transistor T1, configured to transmit a start signal STV or an output signal Out(n-1) from a (n-1)-th stage output terminal to the first electrode of the first transistor T1.

Figure 5E:
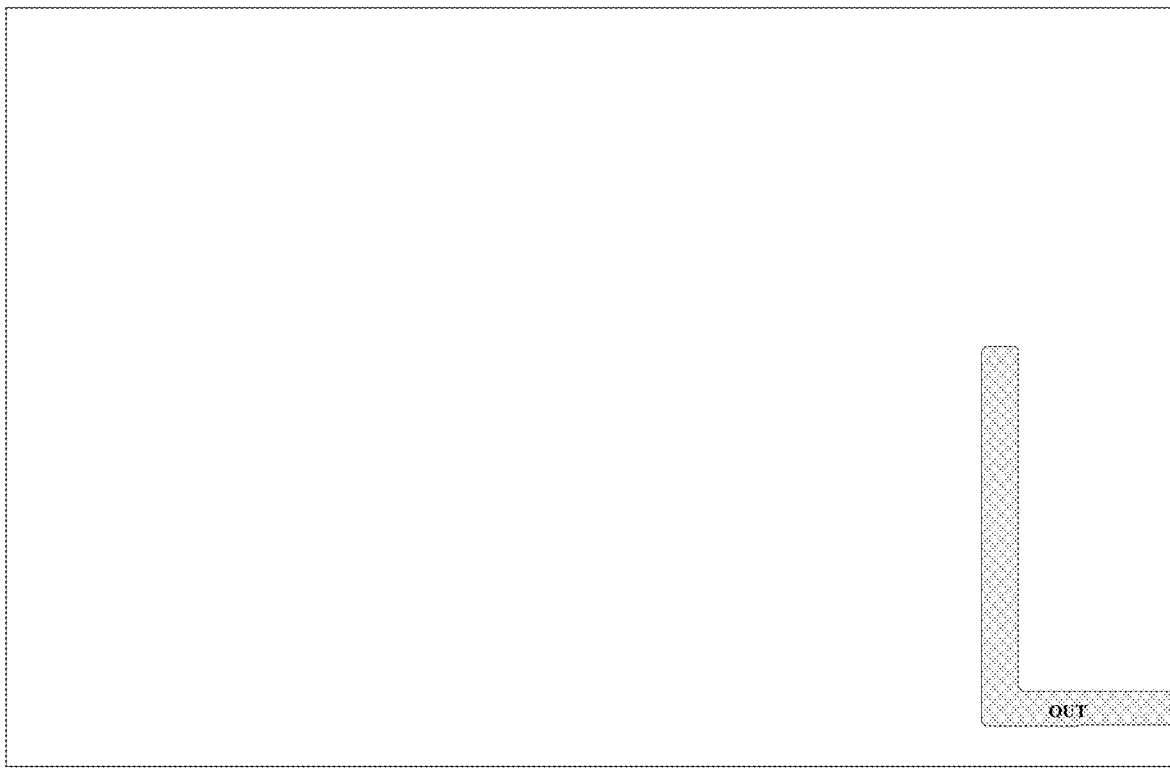
FIG. 5E illustrates the structure of a third conductive layer in the scan circuit depicted in FIG. 5A.

FIG. 5E illustrates the structure of a third conductive layer in the scan circuit depicted in FIG. 5A. Referring to FIG. 5E, the third conductive layer (e.g., corresponding to Gate3 in FIG. 4C) includes an output signal line OUT electrically connected to second electrodes of the ninth transistor T9 and the tenth transistor T10.

Figure 5F:
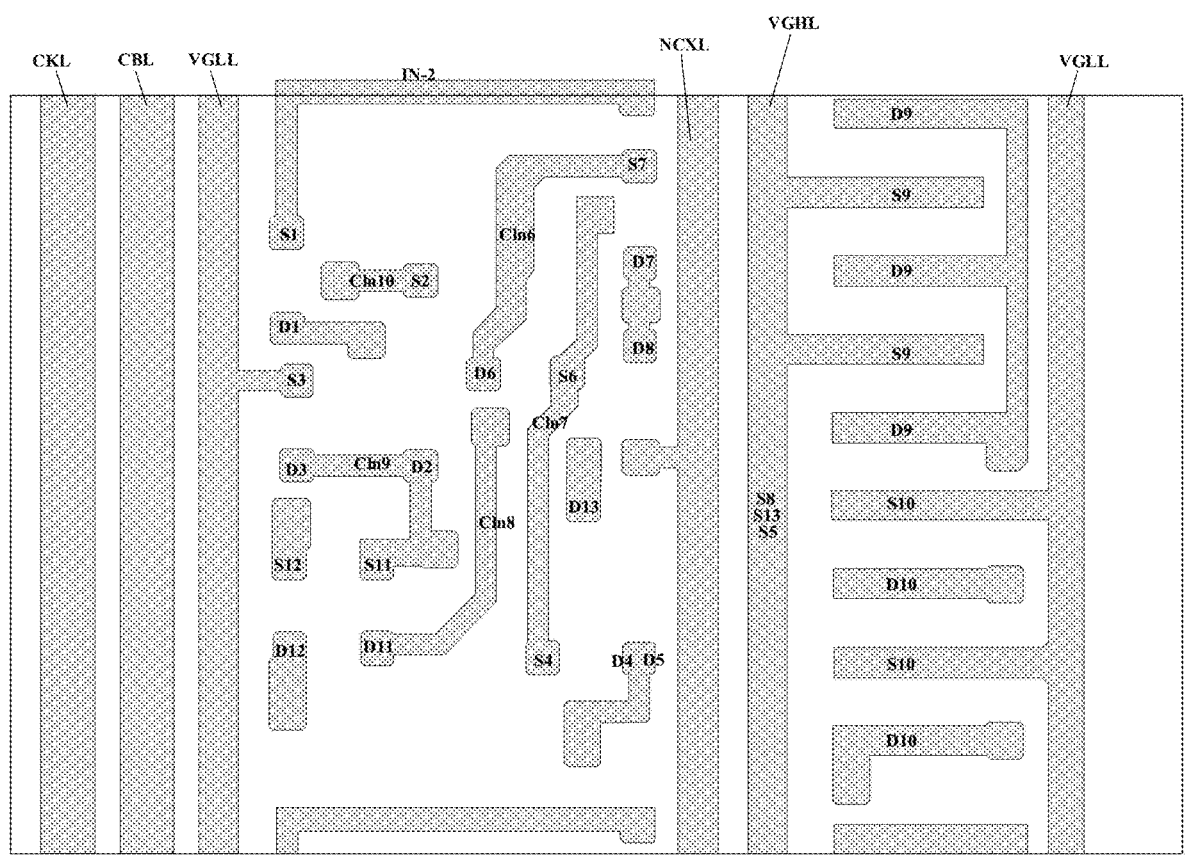
FIG. 5F illustrates the structure of a first signal line layer in the scan circuit depicted in FIG. 5A.

FIG. 5F illustrates the structure of a first signal line layer in the scan circuit depicted in FIG. 5A. Referring to FIG. 5F, the first signal line layer (e.g., corresponding to SLL1 in FIG. 4A to FIG. 4C) includes first electrodes and second electrodes of transistors in the scan circuit. Referring to FIG. 5A and FIG. 5F, in some embodiments, the first electrode S1 of the first transistor T1, the first electrode S2 of the second transistor T2, the first electrode S3 of the third transistor T3, the first electrode S4 of the fourth transistor T4, the first electrode S5 of the fifth transistor T5, the first electrode S6 of the sixth transistor T6, the first electrode S7 of the seventh transistor T7, the first electrode S8 of the eighth transistor T8, the first electrode S9 of the ninth transistor T9, the first electrode S10 of the tenth transistor T10, the first electrode S11 of the eleventh transistor T11, the first electrode S12 of the twelfth transistor T12, the first electrode S13 of the thirteenth transistor T13, the second electrode D1 of the first transistor T1, the second electrode D2 of the second transistor T2, the second electrode D3 of the third transistor T3, the second electrode D4 of the fourth transistor T4, the second electrode D5 of the fifth transistor T5, the second electrode D6 of the sixth transistor T6, the second electrode D7 of the seventh transistor T7, the second electrode D8 of the eighth transistor T8, the second electrode D9 of the ninth transistor T9, the second electrode D10 of the tenth transistor T10, the second electrode D11 of the eleventh transistor T11, the second electrode D12 of the twelfth transistor T12, and the second electrode D13 of the thirteenth transistor T13, are in a same layer.

In some embodiments, the first signal line layer further includes a first clock signal line CKL configured to provide a first clock signal, a second clock signal line CBL configured to provide a second clock signal, a first power supply signal line VGHL configured to provide a first power supply signal, a second power supply signal line VGLL configured to provide a second power supply signal, and a NCX signal line NCXL configured to provide a NCX signal.

Figure 5G:
FIG. 5G illustrates vias connecting a first signal line layer and a semiconductor material layer in the scan circuit depicted in FIG. 5A.
Figure 5H:
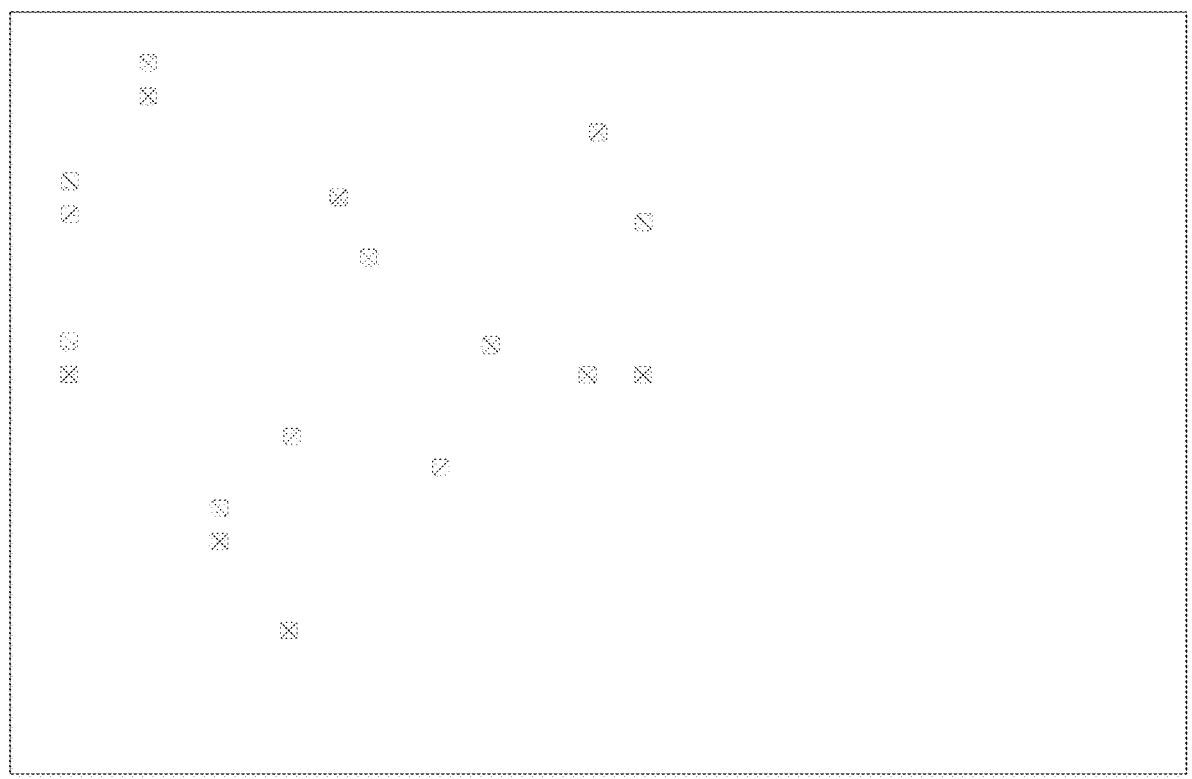
FIG. 5H illustrates vias connecting a first signal line layer and a first conductive layer in the scan circuit depicted in FIG. 5A.
Figure 5I:
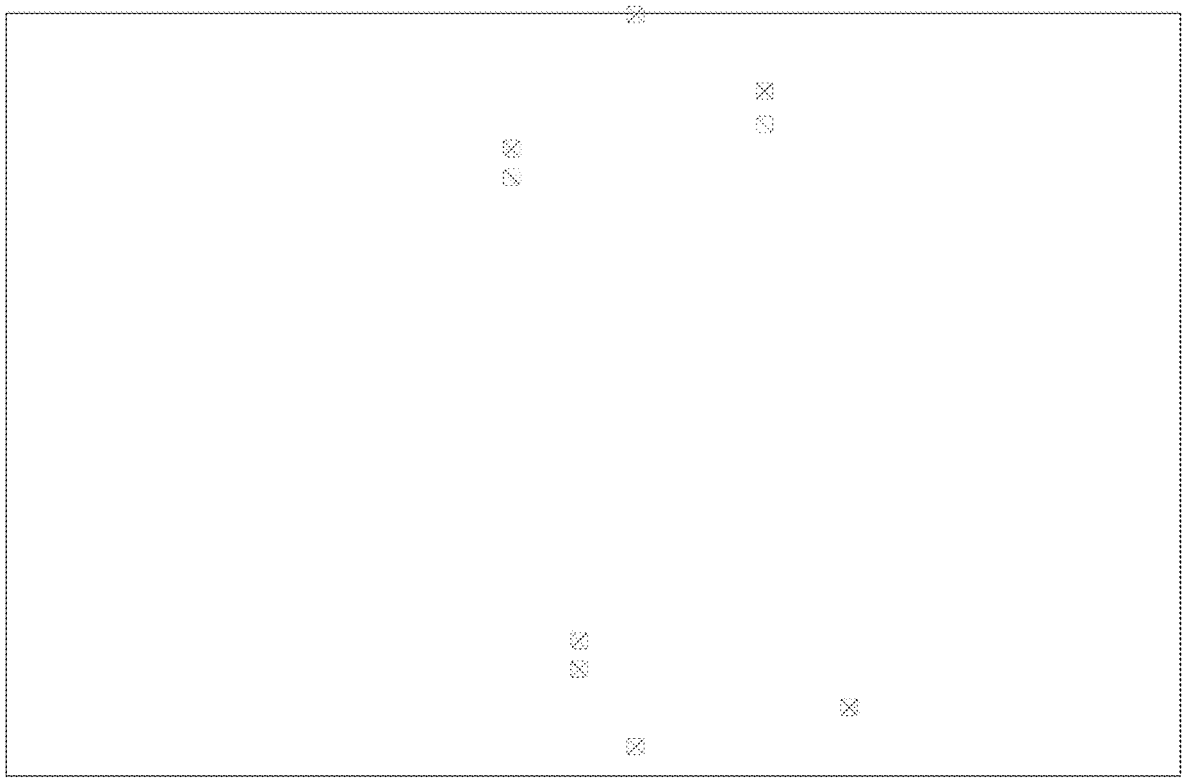
FIG. 5I illustrates vias connecting a first signal line layer and a second conductive layer in the scan circuit depicted in FIG. 5A.
Figure 5J:
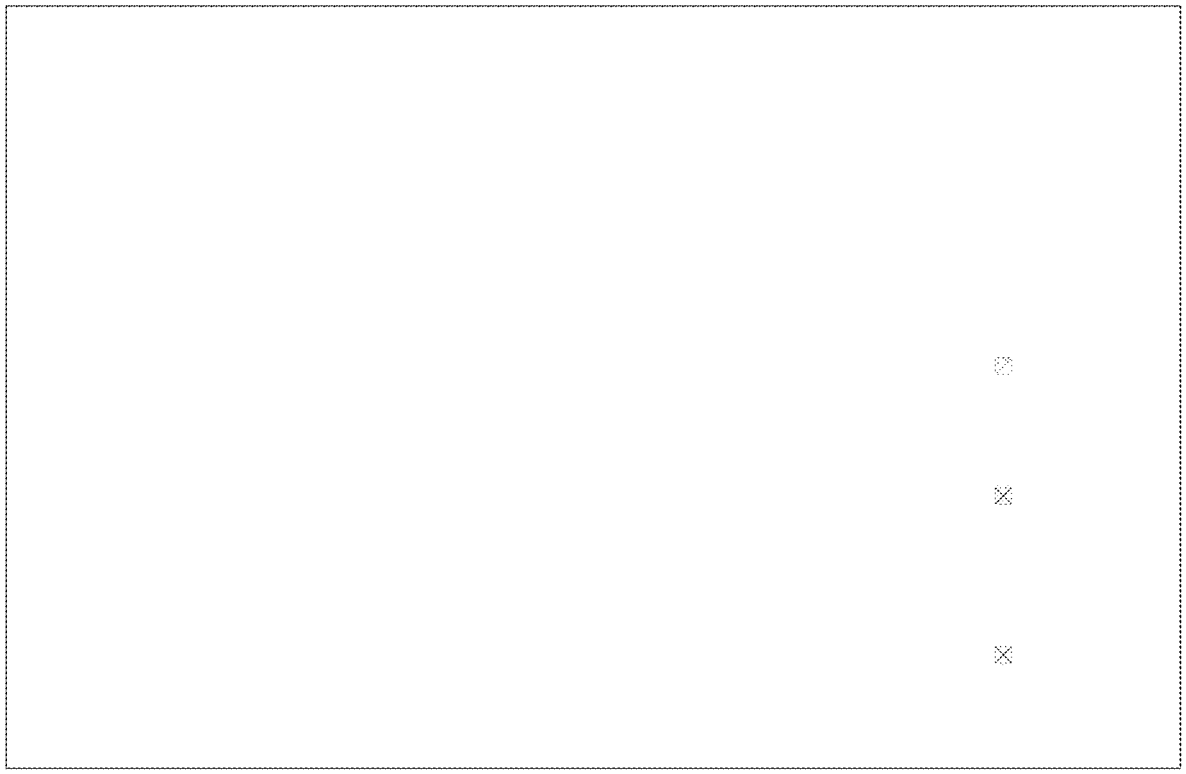
FIG. 5J illustrates vias connecting a first signal line layer and a third conductive layer in the scan circuit depicted in FIG. 5A.

FIG. 5G illustrates vias connecting a first signal line layer and a semiconductor material layer in the scan circuit depicted in FIG. 5A. FIG. 5H illustrates vias connecting a first signal line layer and a first conductive layer in the scan circuit depicted in FIG. 5A. FIG. 5I illustrates vias connecting a first signal line layer and a second conductive layer in the scan circuit depicted in FIG. 5A. FIG. 5J illustrates vias connecting a first signal line layer and a third conductive layer in the scan circuit depicted in FIG. 5A. Referring to FIG. 5A, FIG. 5E, FIG. 5F, and FIG. 5J, the output signal line OUT is electrically connected to second electrodes of the ninth transistor T9 and the tenth transistor T10. FIG. 5J depicts the vias connecting the output signal line OUT to the second electrodes of the ninth transistor T9 and the tenth transistor T10.

In some embodiments, referring to FIG. 5A to FIG. 5J, the first conductive layer further includes a first connecting line Cln1 connecting the gate electrode G7 of the seventh transistor T7 to a second clock signal line CBL; a second connecting line Cln2 connecting the gate electrode G8 of the eighth transistor T8, the second electrode D13 of the thirteenth transistor T13, the second electrode D12 of the twelfth transistor T12, and the gate electrode G2 of the second transistor T2 together; a third connecting line Cln3 connecting the gate electrode G1 of the first transistor T1 to a first clock signal line CKL; a fourth connecting line Cln4 connecting the gate electrode G3 of the third transistor T3 to the first clock signal line CKL; and a fifth connecting line Cln5 connecting a ninth connecting line Cln9 (in the first signal line layer) to the gate electrode G5 of the fifth transistor T5.

In some embodiments, referring to FIG. 5A to FIG. 5J, the first signal line layer further includes a sixth connecting line Cln6 connecting the first electrode S7 of the seventh transistor T7, the second electrode D6 of the sixth transistor T6, and the second capacitor electrode Ce1-2 of the first capacitor C1 together; a seventh connecting line Cln7 connecting the first electrode S6 of the sixth transistor T6, the first electrode S4 of the fourth transistor T4, the gate electrode G7 of the seventh transistor T7 together; an eighth connecting line Cln8 connecting the second electrode D11 of the eleventh transistor T11 to the gate electrode G6 of the sixth transistor T6; a ninth connecting line Cln9 connecting the second electrode D2 of the second transistor T2, the first electrode S11 of the eleventh transistor T11, the second electrode D3 of the third transistor T3, and the fifth connecting line Cln5 together; and a tenth connecting line Cln10 connecting the first electrode S2 of the second transistor T2 to the gate electrode GI of the first transistor T1.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 6:
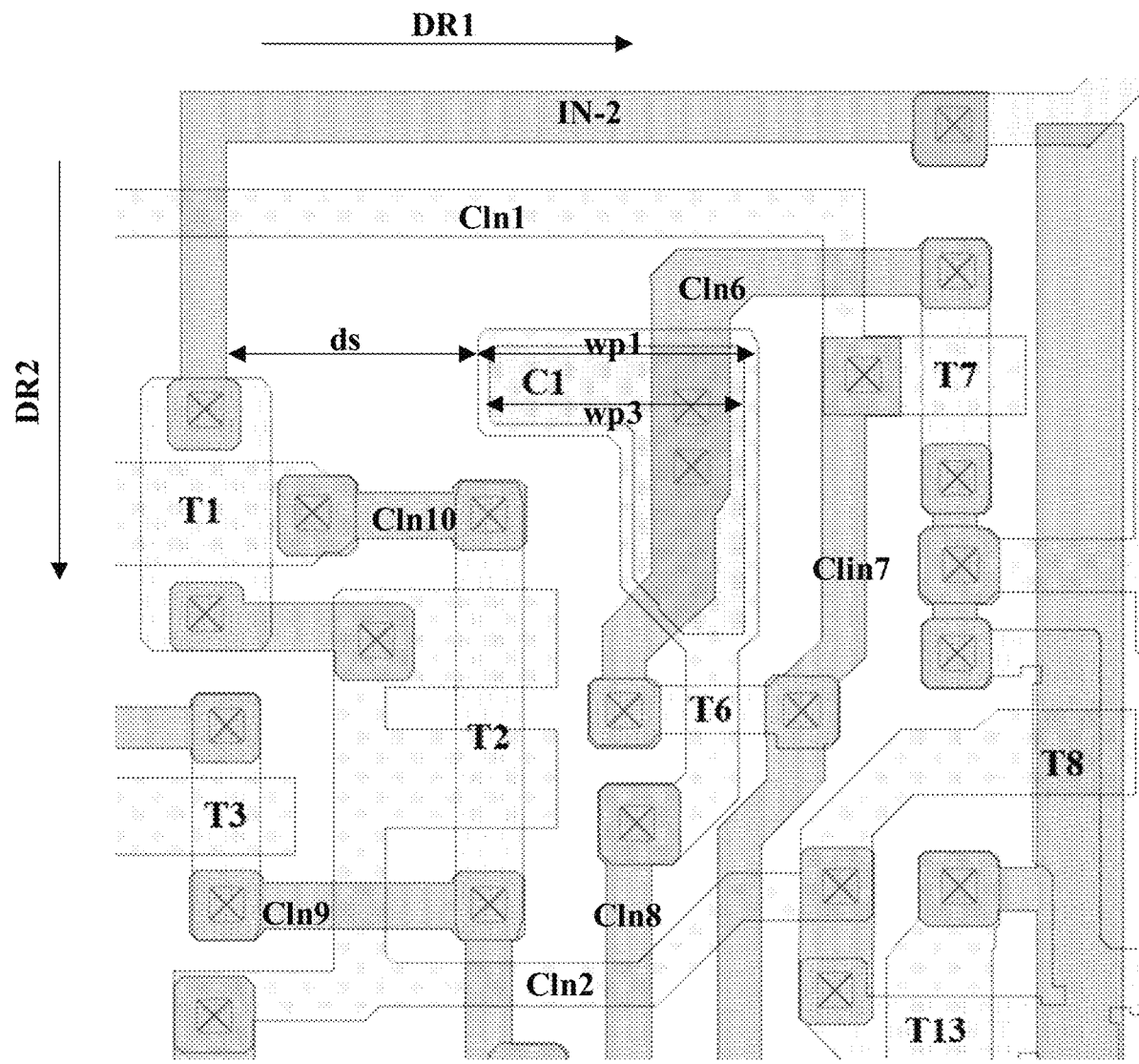
FIG. 6 is a zoom-in view of a region of the scan circuit in some embodiments according to the present disclosure.

FIG. 6 is a zoom-in view of a region of the scan circuit in some embodiments according to the present disclosure. Referring to FIG. 6, in some embodiments, the first capacitor C1 and an active layer of the sixth transistor T6 is in a region surrounded by the first connecting line Cln1 (extending substantially along a first direction DR1) in the first conductive layer, a portion of the second line portion IN-2 of the input signal line (the portion extending substantially along a second direction DR2) in the first signal line layer, the seventh connecting line Cln7 (extending substantially along the second direction DR2) in the first signal line layer, the second connecting line Cln2 (extending substantially along the first direction DR1) in the first conductive layer, the tenth connecting line Cln10 (extending substantially along the first direction DR1) in the first signal line layer, and an active layer of the second transistor T2. As used herein, the term "substantially along" means a deviation no more than 15 degrees, e.g., 0 degree, 0 degree to approximately 1 degree, approximately 1 degree to approximately 2 degrees, approximately 2 degree to approximately 5 degrees, approximately 5 degree to approximately 10 degrees, and approximately 10 degree to approximately 15 degrees.

Figure 7:
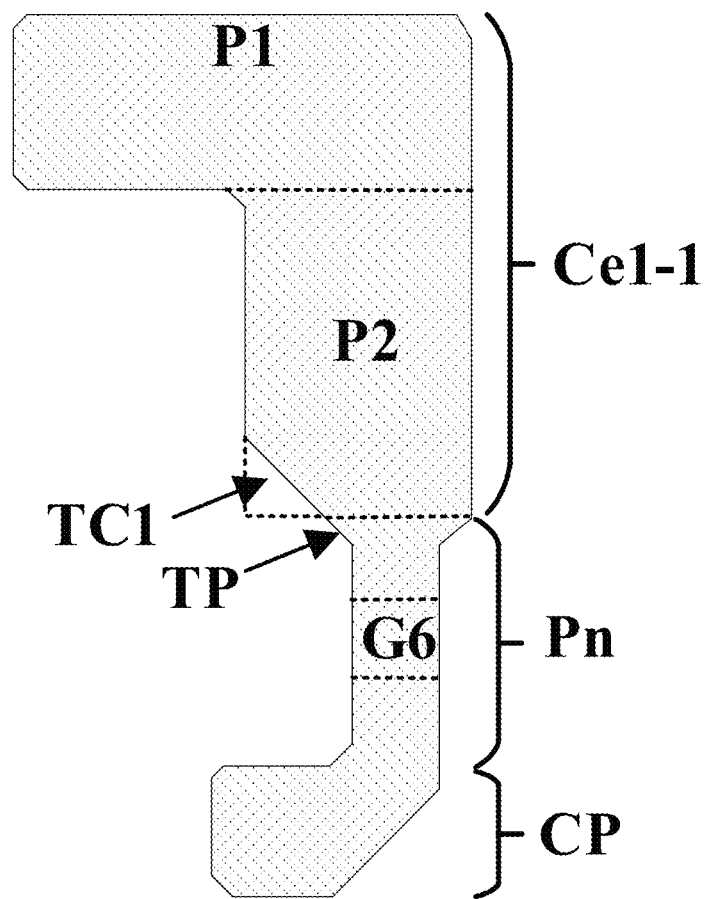
FIG. 7 illustrates a unitary structure comprising a first capacitor electrode of a first capacitor and a gate electrode of a sixth transistor in some embodiments according to the present disclosure.

FIG. 7 illustrates a unitary structure comprising a first capacitor electrode of a first capacitor and a gate electrode of a sixth transistor in some embodiments according to the present disclosure. Referring to FIG. 7, the first capacitor electrode Ce1-1 of the first capacitor C1 has a L shape, a first part P1 of the first capacitor electrode Ce1-1 extends substantially along the first direction DR1, a second part P2 of the first capacitor electrode Ce1-1 extends substantially along the second direction DR2. The second part P2 is an intermediate part of the unitary structure between the first part P1 and the gate electrode G6 of the sixth transistor T6. A width along the first direction DR1 of the first part PI is greater than a width along the first direction DR1 of the second part P2, which is in turn greater than a width along the first direction DR1 of the gate electrode G6 of the sixth transistor T6. In some embodiments, the second part P2 has a first truncated corner TC1.

Figure 8:
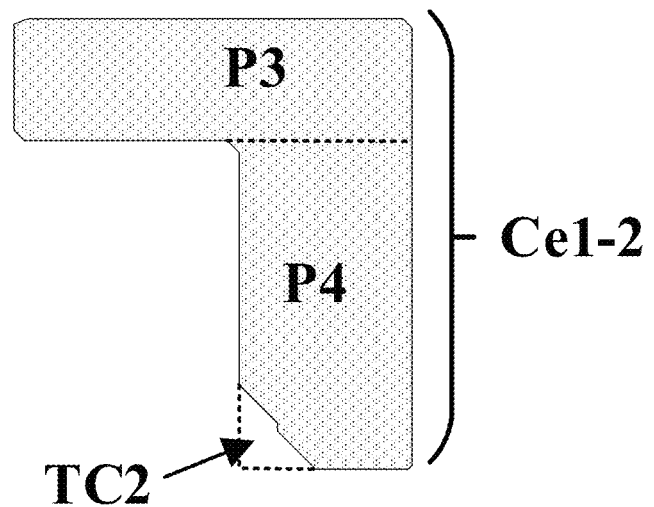
FIG. 8 illustrates a structure of a second capacitor electrode of a first capacitor in some embodiments according to the present disclosure.

FIG. 8 illustrates a structure of a second capacitor electrode of a first capacitor in some embodiments according to the present disclosure. Referring to FIG. 8, the second capacitor electrode Ce1-2 of the first capacitor C1 has a L shape, a third part P3 of the second capacitor electrode Ce1-2 extends substantially along the first direction DR1, a fourth part P4 of the second capacitor electrode Ce1-2 extends substantially along the second direction DR2. A width along the first direction DR1 of the third part P3 is greater than a width along the first direction DR1 of the fourth part P4. In some embodiments, the fourth part P4 has a second truncated corner TC2.

Referring to FIG. 6 and FIG. 7, a ratio of a width wp1 along the first direction DR1 of the first part P1 to a shortest distance ds between the first part PI and the portion of the second line portion IN-2 of the input signal line extending substantially along the second direction DR2 is no more than 2.0:1, e.g., no more than 1.9:1, no more than 1.8:1, no more than 1.7:1, no more than 1.6:1, no more than 1.5:1, no more than 1.4:1, no more than 1.3:1, no more than 1.2:1, no more than 1.1:1, no more than 1.0:1, no more than 0.9:1, no more than 0.8:1 or no more than 0.7:1.

Referring to FIG. 6 and FIG. 8, a ratio of a width wp3 along the first direction DR1 of the third part P3 to a shortest distance ds between the third part P3 and the portion of the second line portion IN-2 of the input signal line extending substantially along the second direction DR2 is no more than 2.0:1. e.g., no more than 1.9:1, no more than 1.8:1, no more than 1.7:1, no more than 1.6:1, no more than 1.5:1, no more than 1.4:1, no more than 1.3:1, no more than 1.2:1, no more than 1.1:1, no more than 1.0:1, no more than 0.9:1, no more than 0.8:1, no more than 0.7:1, no more than 0.6:1, or no more than 0.5:1.

By having these ranges of ratios provided in the present disclosure, the capacitance of the first capacitor C1 can be limited below a threshold value, effectively suppressing the coupling fluctuation between the first clock signal CK and the second clock signal CB, as discussed above. In some embodiments, an overlapping area between the first capacitor electrode Ce1-1 and the second capacitor electrode Ce1-2 of the first capacitor C1 is no more than 400 $\mu m^2$, for example, no more than 390 $\mu m^2$, no more than 380 $\mu m^2$, no more than 370 $\mu m^2$, no more than 360 $\mu m^2$, no more than 350 $\mu m^2$, no more than 340 $\mu m^2$, no more than 330 $\mu m^2$, no more than 320 $\mu m^2$, no more than 310 $\mu m^2$, no more than 300 $\mu m^2$, no more than 290 $\mu m^2$, no more than 280 $\mu m^2$, no more than 270 $\mu m^2$, no more than 260 $\mu m^2$, no more than 250 $\mu m^2$, no more than 240 $\mu m^2$, no more than 230 $\mu m^2$, no more than 220 $\mu m^2$, no more than 210 $\mu m^2$, or no more than 200 $\mu m^2$. Optionally, the overlapping area is no more than 200 $\mu m^2$.

Referring to FIG. 7, the unitary structure in some embodiments includes the first part P1 of the first capacitor electrode Ce1-1, the second part P2 of the first capacitor electrode Ce1-1, and a narrow part Pn comprising the gate electrode G6 of the sixth transistor T6. The narrow part Pn is directly connected to the second part P2. A width along the first direction DR1 of the narrow part Pn is smaller than a width along the first direction DR1 of the second part P2, which is in turn smaller than a width along the first direction DR1 of the first part PI. In one example depicted in FIG. 7, the narrow part Pn comprises a transition portion TP where the narrow part Pn connects to the second part P2. A width along the first direction DR1 of the transition portion TP gradually decreases along the second direction DR2.

Referring to FIG. 7, the unitary structure in some embodiments further includes a connecting portion CP where the unitary structure connects to the eighth connecting line Cln8. A width along the first direction DR1 of the connecting portion CP is greater than the width along the first direction DR1 of the narrow part Pn.

Figure 9:
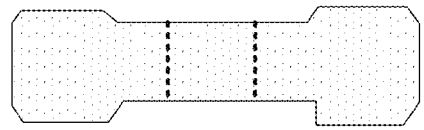
FIG. 9 illustrates a structure of a second capacitor electrode of a first capacitor in some embodiments according to the present disclosure.

FIG. 9 illustrates a structure of a second capacitor electrode of a first capacitor in some embodiments according to the present disclosure. Referring to FIG. 9, an isolated portion of the semiconductor material layer comprising the active layer ACT6 of the sixth transistor T6 has a dumbbell shape. Two heads of the dumbbell shape are where the isolated portion connected to the first electrode S6 and the second electrode D6 of the sixth transistor T6 (see. e.g., FIG. 5A, FIG. 5B, and FIG. 5F). The rod connecting two heads of the dumbbell shape is where the active layer ACT6 is located. Widths along the second direction DR2 of the two heads are greater than a width along the second direction DR2 of the rod connecting two heads.

By having the intricate structure of the first capacitor electrode Ce1-1 and the active layer ACT6 of the sixth transistor T6, an area of the channel of the sixth transistor T6 can be reduced, further effectively suppressing the coupling fluctuation between the first clock signal CK and the second clock signal CB, as discussed above. In some embodiments, a ratio of channel width to channel length of the active layer ACT6 of the sixth transistor T6 is in a range of 0.8:1 to 1:0.8. e.g., 0.8:1 to 0.9:1, 0.9:1 to 1:1, 1:1 to 1:0.9, or 1:0.9 to 1:0.8. Optionally, the ratio of channel width to channel length of the active layer ACT6 of the sixth transistor T6 is approximately 1:1. Optionally, the active layer ACT6 of the sixth transistor T6 has a channel width less than 4.5 µm. e.g., less than 4.4 µm, less than 4.3 µm, less than 4.2 µm, less than 4.1 µm, less than 4.0 µm, less than 3.9 µm, less than 3.8 µm, less than 3.7 µm, less than 3.6 µm, less than 3.5 µm, or less than 3.4 µm. In one example, the channel width is approximately 3.3 µm. Optionally, the active layer ACT6 of the sixth transistor T6 has a channel length less than 5.8 µm, e.g., less than 5.6 µm, less than 5.4 µm, less than 5.2 µm, less than 5.0 µm, less than 4.8 µm, less than 4.6 µm, less than 4.4 µm, less than 4.2 µm, less than 4.0 µm, less than 3.8 µm, less than 3.6 µm, or less than 3.4 µm. In one example, the channel length is approximately 3.3 µm.

Figure 10:
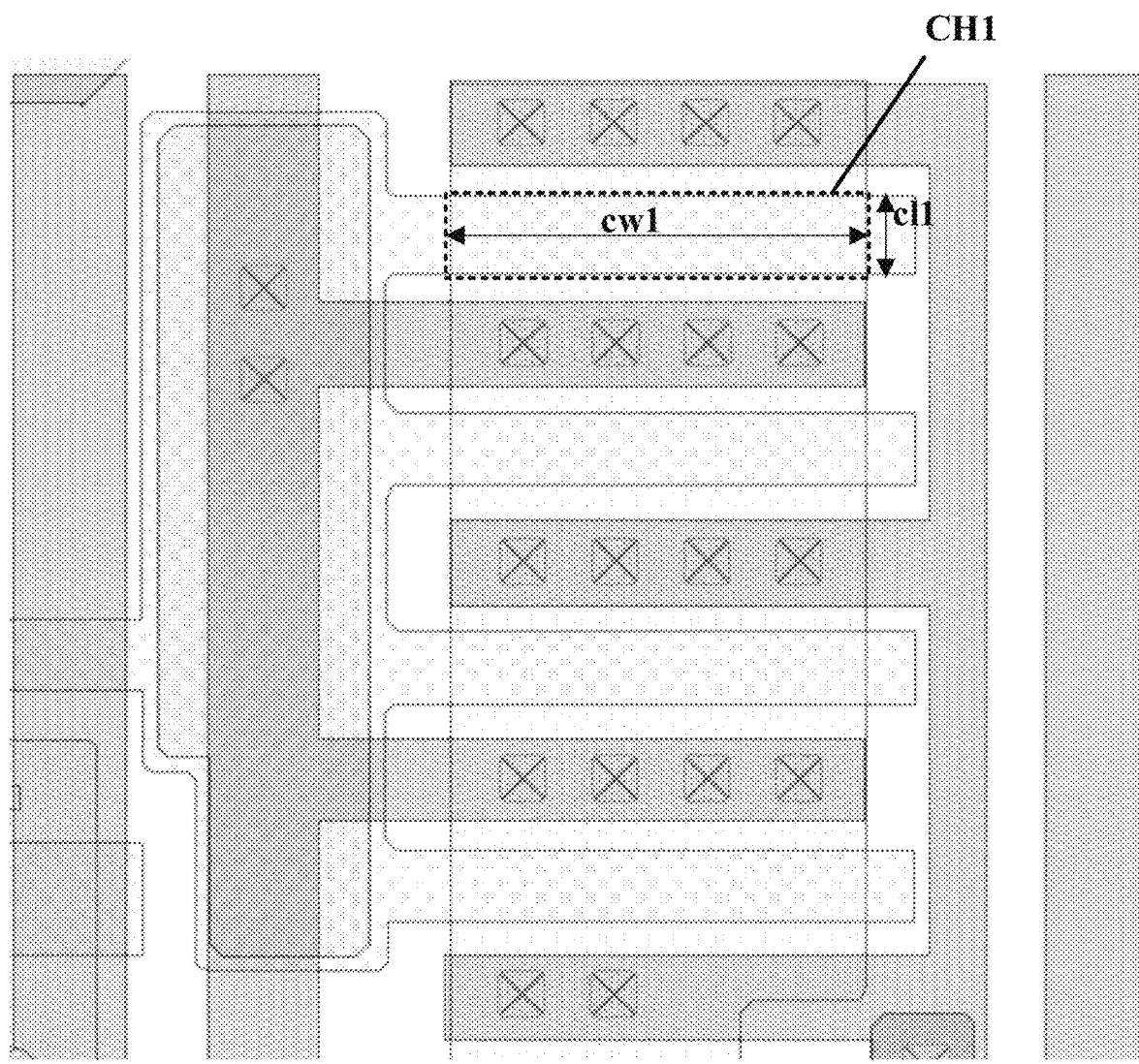
FIG. 10 is a zoom-in view of a region of the scan circuit in some embodiments according to the present disclosure.

As discussed above, the ninth transistor T9 in some embodiments is a multi-gate transistor. Correspondingly, the active layer ACT9 of the ninth transistor T9 in some embodiments includes multiple channel parts. FIG. 10 is a zoom-in view of a region of the scan circuit in some embodiments according to the present disclosure. A respective channel part of the active layer ACT9 is annotated as CH1 in FIG. 10. Referring to FIG. 5A, FIG. 5B, and FIG. 10, the active layer ACT9 of the ninth transistor T9 in some embodiments includes m numbers of channels parts spaced apart from each other, m is an integer greater than 2, e.g., 3, 4, 5, 6, 7, 8, 9, and 10. In one example as depicted in FIG. 10, m=4. As depicted in FIG. 10, the respective channel part CH1 of the active layer ACT9 has a channel width cw1 and a channel length c11.

In some embodiments, a ratio of (m*cw1) to c11 is greater than 22:1, e.g., greater than 23:1, greater than 24:1, greater than 25:1, greater than 26:1, greater than 27:1, greater than 28:1, greater than 29:1, greater than 30:1, greater than 31:1, greater than 32:1, greater than 33:1, greater than 34:1, greater than 35:1, greater than 36:1, greater than 37:1, greater than 38:1, greater than 39:1, or greater than 40:1. In one example, the ratio of (m*cw1) to c11 is greater than 29:1. In another example, m=4.

In some embodiments, a ratio of cw1 to c11 is greater than 5.5:1, e.g., greater than 5.6:1, greater than 5.7:1, greater than 5.8:1, greater than 5.9:1, greater than 6.0:1, greater than 6.1:1, greater than 6.2:1, greater than 6.3:1, greater than 6.4:1, greater than 6.5:1, greater than 6.6:1, greater than 6.7:1, greater than 6.8:1, greater than 6.9:1, greater than 7.0:1, greater than 7.1:1, greater than 7.2:1, greater than 7.3:1, greater than 7.4:1, greater than 7.5:1, greater than 7.6:1, greater than 7.7:1, greater than 7.8:1, greater than 7.9:1, greater than 8.0:1, greater than 8.1:1, greater than 8.2:1, greater than 8.3:1, greater than 8.4:1, greater than 8.5:1, greater than 8.6:1, greater than 8.7:1, greater than 8.8:1, greater than 8.9:1, or greater than 9.0:1. In one example, the ratio of cw1 to c11 is greater than 7.2:1.

Optionally, c11 is less than 4.6 µm. e.g., less than 4.5 µm, less than 4.4 µm, less than 4.3 µm, less than 4.2 µm, less than 4.1 µm, less than 4.0 µm, less than 3.9 µm, less than 3.8 µm, less than 3.7 µm, less than 3.6 µm. In one example, c11 is approximately 3.5 µm.

Optionally, ow1 is in a range of 15 µm to 35 µm, e.g. 15 µm to 20 µm, 20 µm to 25 µm, 25 µm to 30 µm, or 30 µm to 35 µm. In one example, cw1 is approximately 25.4 µm.

Figure 11:
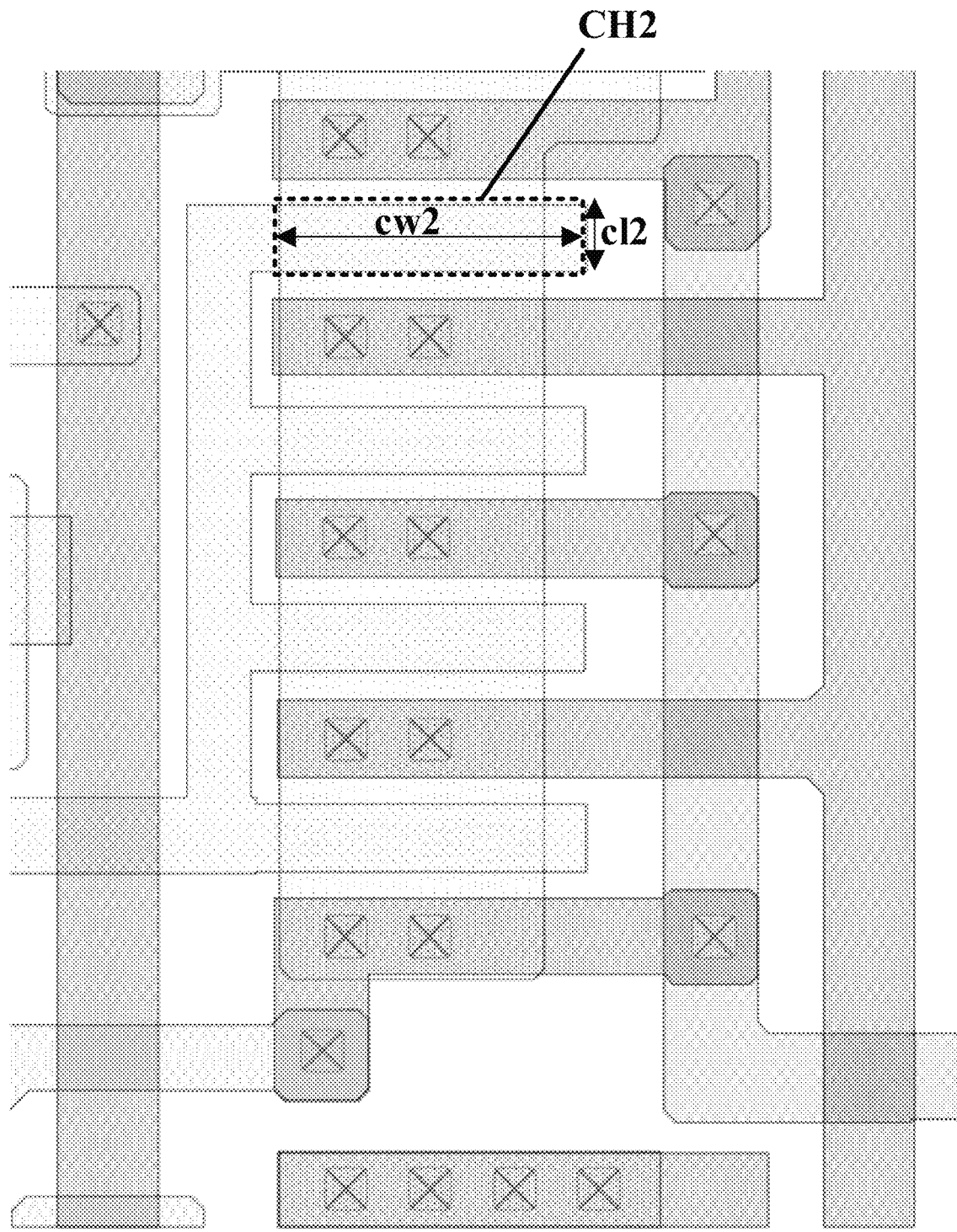
FIG. 11 is a zoom-in view of a region of the scan circuit in some embodiments according to the present disclosure.

As discussed above, the tenth transistor T10 in some embodiments is a multi-gate transistor. Correspondingly, the active layer ACT10 of the tenth transistor T10 in some embodiments includes multiple channel parts. FIG. 11 is a zoom-in view of a region of the scan circuit in some embodiments according to the present disclosure. A respective channel part of the active layer ACT10 is annotated as CH2 in FIG. 11. Referring to FIG. 5A, FIG. 5B, and FIG. 11, the active layer ACT10 of the tenth transistor T10 in some embodiments includes n numbers of channels parts spaced apart from each other, n is an integer greater than 2, e.g., 3, 4, 5, 6, 7, 8, 9, and 10. In one example as depicted in FIG. 11, n=4. As depicted in FIG. 10, the respective channel part CH2 of the active layer ACT10 has a channel width cw2 and a channel length c12.

In some embodiments, a ratio of (n*cw2) to c12 is greater than 13:1, e.g., greater than 13.5:1, greater than 14:1, greater than 14.5:1, greater than 15:1, greater than 15.5:1, greater than 16:1, greater than 16.5:1, greater than 17:1, greater than 17.5:1, greater than 18:1, greater than 18.5:1, greater than 19:1, greater than 19.5:1, greater than 20:1, greater than 20.5:1, greater than 21:1, greater than 21.5:1, or greater than 22:1. In one example, the ratio of (n*cw2) to c12 is greater than 17:1. In another example, n=4.

In some embodiments, a ratio of cw2 to c12 is greater than 3.3:1, e.g., greater than 3.4:1, greater than 3.5:1, greater than 3.6:1, greater than 3.7:1, greater than 3.8:1, greater than 3.9:1, greater than 4.0:1, greater than 4.1:1, greater than 4.2:1, greater than 4.3:1, greater than 4.4:1, greater than 4.5:1, greater than 4.6:1, greater than 4.7:1, greater than 4.8:1, greater than 4.9:1, greater than 5.0:1, greater than 5.1:1, greater than 5.2:1, greater than 5.3:1, greater than 5.4:1, greater than 5.5:1, greater than 5.6:1, greater than 5.7:1, greater than 5.8:1, greater than 5.9:1, greater than 6.0:1, greater than 6.1:1, greater than 6.2:1, greater than 6.3:1, greater than 6.4:1, greater than 6.5:1, greater than 6.6:1, greater than 6.7:1, or greater than 6.8:1. In one example, the ratio of cw2 to c12 is greater than 4.3:1, e.g., approximately 4.4:1.

Optionally, c12 is less than 4.6 µm, e.g., less than 4.5 µm, less than 4.4 µm, less than 4.3 µm, less than 4.2 µm, less than 4.1 µm, less than 4.0 µm, less than 3.9 µm, less than 3.8 µm, less than 3.7 µm, less than 3.6 µm. In one example, c12 is approximately 3.5 µm.

Optionally, cw2 is in a range of 5 µm to 25 µm. e.g., 5 µm to 10 µm, 10 µm to 15 µm, 15 µm to 20 µm, or 20 µm to 25 µm. In one example, cw2 is approximately 15.4 µm.

By having these ranges of ratios for the ninth transistor and/or the tenth transistor provided in the present disclosure, areas of the channels of the ninth transistor and/or the tenth transistor can be reduced, further effectively suppressing the coupling fluctuation between the first clock signal CK and the second clock signal CB, as discussed above.

Figure 12:
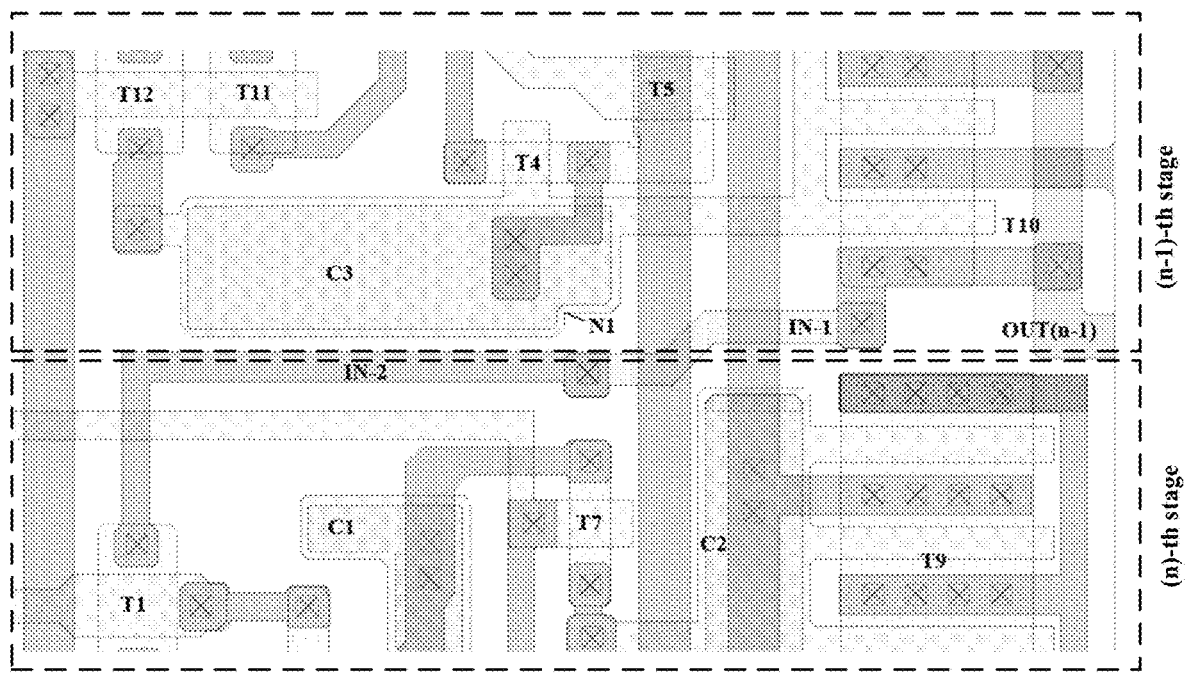
FIG. 12 is a zoom-in view of a region of the scan circuit in some embodiments according to the present disclosure.

As discussed above, the inventors of the present disclosure further discover that a reduction in parasitic capacitance between the input signal line connected to an output terminal of a preceding stage and the first node can additionally reduce the fluctuations in the gate driving signals. FIG. 12 is a zoom-in view of a region of the scan circuit in some embodiments according to the present disclosure. Referring to FIG. 12, an input signal line IN for providing an input signal to the first transistor T1 in a (n)-th stage of the scan circuit is connected to an output terminal Out(n−1) of a (n−1)-th stage of the scan circuit. The input signal line IN is adjacent to the N1 node (e.g., the first node N1 including a first capacitor electrode of the first capacitor C1) in the (n−1)-th stage of the scan circuit, thus a parasitic capacitance is formed between the input signal line IN and the first node N1. In some embodiments, the input signal line IN includes a first line portion IN-1 in the second conductive layer and a second line portion IN-2 in the first signal line layer. Optionally, the second line portion IN-2 includes at least a portion of the input signal line IN having the shortest distance to the first capacitor electrode of the first capacitor C1 in the (n−1)-th stage of the scan circuit. The at least a portion of the input signal line IN extends along a part of a periphery of the first capacitor electrode of the first capacitor C1 in the (n−1)-th stage of the scan circuit. By having the second line portion IN-2 in the first signal line layer, at least the portion of the input signal line IN having the shortest distance to the first capacitor electrode of the first capacitor C1 is further spaced apart from the first capacitor electrode of the first capacitor C1, reducing the parasitic capacitance between them.

Optionally, the second line portion IN-2 may be disposed in other layers. In one example, the second line portion IN-2 is in the second signal line layer (SLL2 in FIG. 4B and FIG.

4C). In another example, the second line portion IN-2 is in a same layer as the anode AD in FIG. 4A to FIG. 4C.

Figure 13:
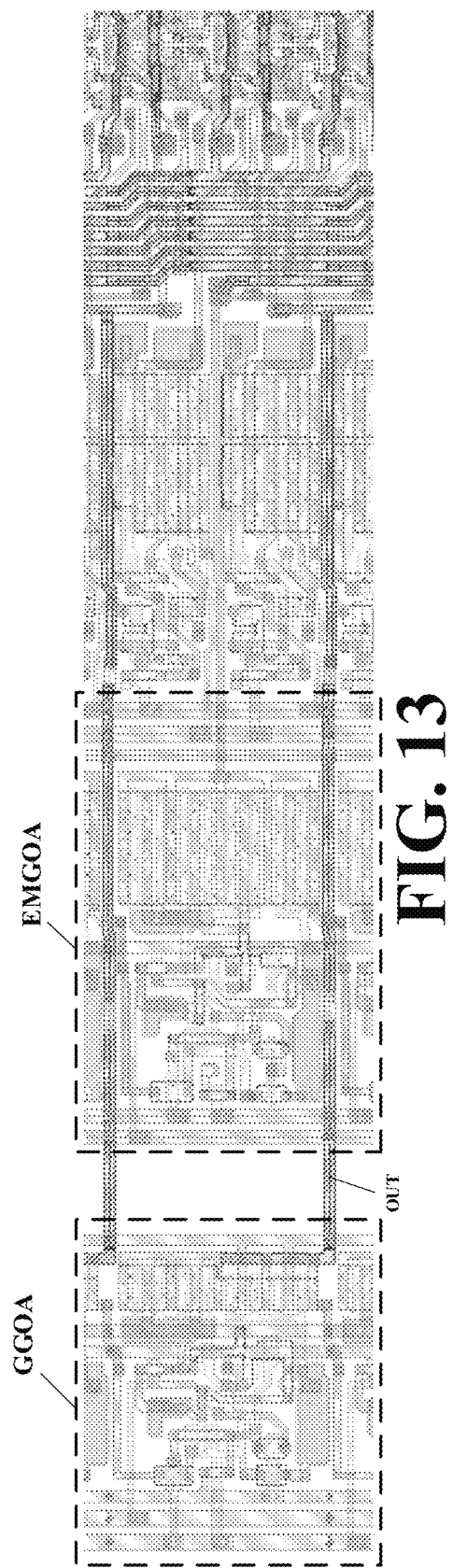
FIG. 13 illustrates the structure of a scan circuit in some embodiments according to the present disclosure.

FIG. 13 illustrates the structure of a scan circuit in some embodiments according to the present disclosure. In some embodiments, a respective stage of the scan circuit includes a stage of gate driving circuit GGOA configured to provide gate driving signals and a stage of emission driving circuit EMGOA configured to provide power supply signals for light emission of the display panel. The structures depicted in FIG. 1, FIG. 5A to FIG. 5J, and FIG. 6 to FIG. 12 are directed to the gate driving circuit GGOA. As shown in FIG. 13, the output signal line OUT crosses through an area of the emission driving circuit EMGOA.

Figure 14:
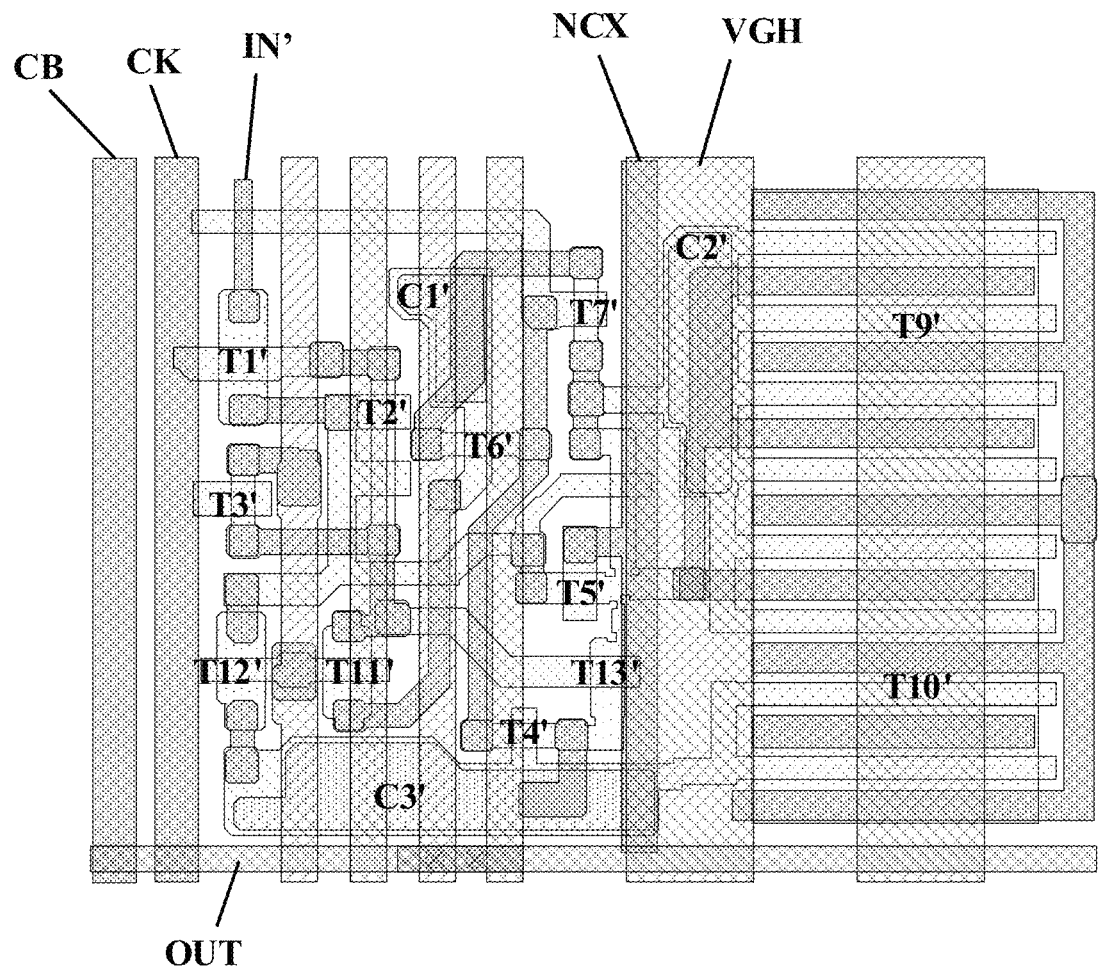
FIG. 14 illustrates the structure of an emission driving circuit EMGOA in a scan circuit in some embodiments according to the present disclosure.

Various appropriate circuit structures may be adopted for the emission driving circuit EMGOA. FIG. 14 illustrates the structure of an emission driving circuit EMGOA in a scan circuit in some embodiments according to the present disclosure. In one specific example depicted in FIG. 14, the emission driving circuit EMGOA has a circuit structure similar to that of FIG. 1. For example, transistors T1', T2', T3',14', T5, T6', T7', T8', T9', T10', T11', T12', T13' correspond to transistors TI to T13 in FIG. 1, respectively; and capacitors C1', C2', and C3' correspond to capacitors C1 to C3 in FIG. 1, respectively; and an input signal line IN' corresponds to the input signal line IN in FIG. 5A. Detailed layouts of the emission driving circuit EMGOA are depicted in FIG. 14.

Figure 15:
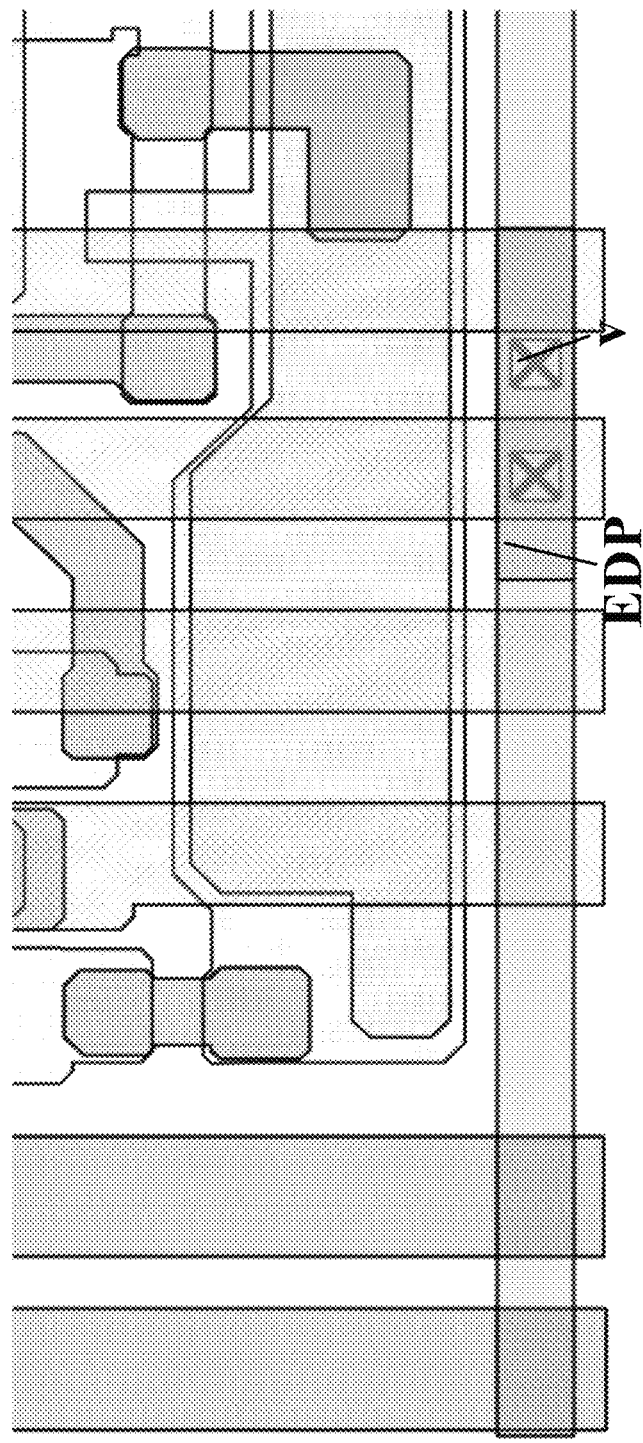
FIG. 15 is a zoom-in view of a region of FIG. 14 where the output signal line crosses over the emission driving circuit.

Referring to FIG. 13 and FIG. 14, the output signal line OUT of the stage of gate driving circuit GGOA crosses over the emission driving circuit EMGOA. Because the output signal line OUT of the stage of gate driving circuit GGOA crosses over the emission driving circuit EMGOA over an elongated distance, electrostatic discharge between the output signal line OUT of the stage of gate driving circuit GGOA and the emission driving circuit EMGOA are prone to occur, damaging the scan circuit, for example, during a process of fabricating the display panel. FIG. 15 is a zoom-in view of a region of FIG. 14 where the output signal line crosses over the emission driving circuit. Referring to FIG. 15, the scan circuit in some embodiments further includes an electrostatic discharge portion EDP configured to discharge electrostatic charges accumulated in the output signal line OUT of the stage of gate driving circuit GGOA. Optionally, the electrostatic discharge portion EDP has a structure that extends from the first signal line layer (corresponding to SLL1 in FIG. 4A to FIG. 4C) through one or more vias v to the third conductive layer (see, e.g., FIG. 5E; corresponding to Gate3 in FIG. 4C), wherein the output signal line OUT of the stage of gate driving circuit GGOA is disposed.

Referring to FIG. 13, FIG. 5A, and FIG. 5F, The NCX signal line NCXL is configured to provide a first power supply signal (e.g., a VGH signal) when the emission driving circuit EMGOA is in operation, and is configured to provide a second power supply signal (e.g., a VGL signal) when the emission driving circuit EMGOA is not in operation. By having a NCX signal line NCXL, flicker in image display (for example, when the display panel is starting up or when the frame rate of image undergoes a change) may be reduced.

In one example, the output signal line OUT of the stage of gate driving circuit GGOA is in the third conductive layer (see, e.g., FIG. 5E; corresponding to Gate3 in FIG. 4C); and the electrostatic discharge portion EDP is in the first signal line layer (corresponding to SLL1 in FIG. 4A to FIG. 4C). The electrostatic discharge portion EDP is connected to the output signal line OUT of the stage of gate driving circuit GGOA through one or more vias v extending through an insulating layer (e.g., a passivation layer PVX in FIG. 4C).

Referring to FIG. 5A to FIG. 5F, and FIG. 6 again, as discussed above, the first signal line layer in some embodiments includes a sixth connecting line Cln6 connecting the first electrode S7 of the seventh transistor T7, the second electrode D6 of the sixth transistor T6, and the second capacitor electrode Ce1-2 of the first capacitor C1 together. Referring to FIG. 5A, FIG. 5C. FIG. 5D, FIG. 5F, and FIG. 6, the sixth connecting line Cln6 in some embodiments crosses over both the first capacitor electrode Ce1-1 and the second capacitor electrode Ce1-2 of the first capacitor C1. An orthographic projection of the sixth connecting line Cln6 on a base substrate at least partially overlaps with an orthographic projection of the first capacitor electrode Ce1-1 on the base substrate, and at least partially overlaps with an orthographic projection of the second capacitor electrode Ce1-2 on the base substrate.

Figure 16:
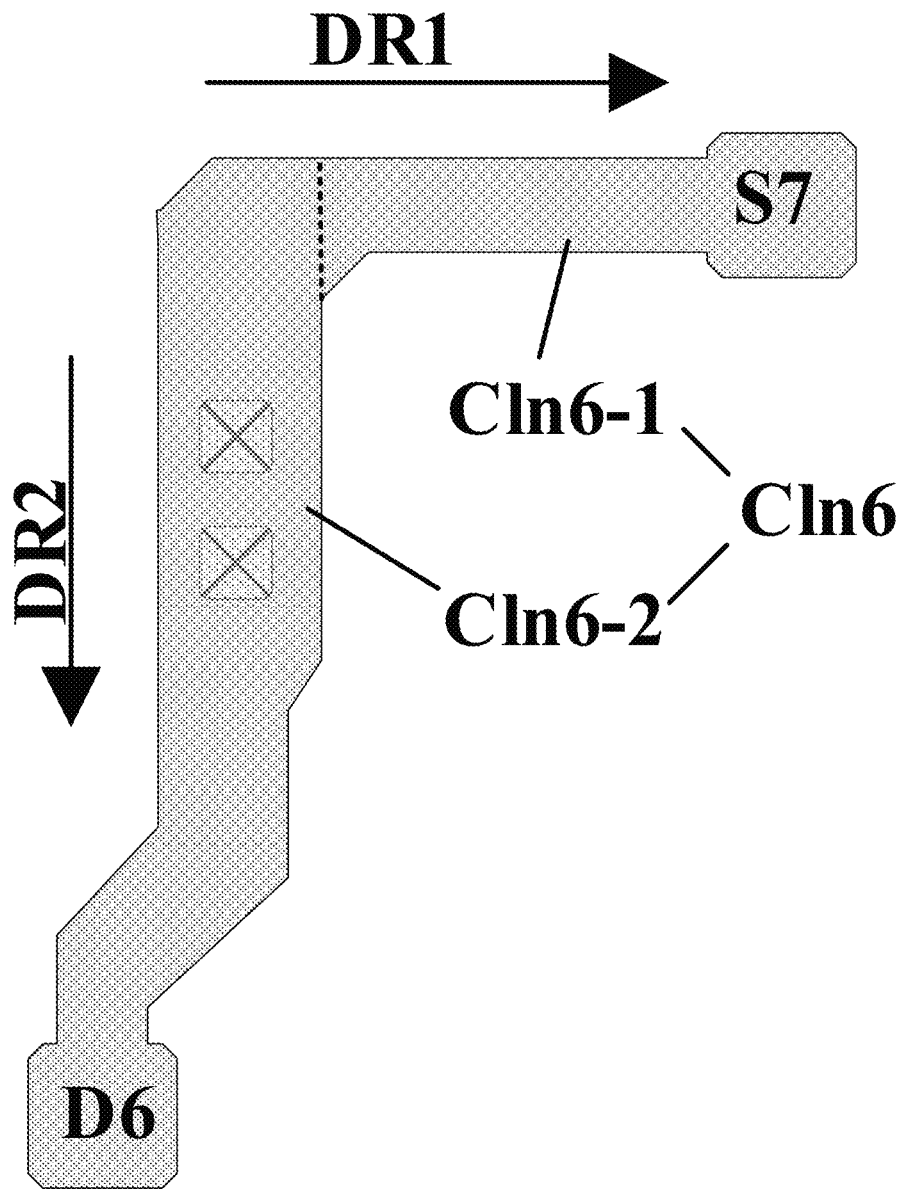
FIG. 16 illustrates the structure of a sixth connecting line in some embodiments according to the present disclosure.

In some embodiments, the sixth connecting line Cln6 has a L shape. FIG. 16 illustrates the structure of a sixth connecting line in some embodiments according to the present disclosure. Referring to FIG. 16, a first-sixth connecting line part Cln6-1 of the sixth connecting line Cln6 extends substantially along the first direction DR1, a second-sixth connecting line part Cln6-2 of the sixth connecting line Cln6 extends substantially along the second direction DR2. The second-sixth connecting line part Cln6-2 is a part of the sixth connecting line Cln6 wherein the sixth connecting line Cln6 connects to the second capacitor electrode Ce1-2 of the first capacitor C1.

Referring to FIG. 6, FIG. 7, and FIG. 16, the first-sixth connecting line part Cln6-1 of the sixth connecting line Cln6 extends in a direction substantially parallel to the extension direction of the first part P1 of the first capacitor electrode Ce1-1 of the first capacitor C1, and the second-sixth connecting line part Cln6-2 of the sixth connecting line Cln6 extends in a direction substantially parallel to the extension direction of the second part P2 of the first capacitor electrode Ce1-1 of the first capacitor C1.

Figure 17:
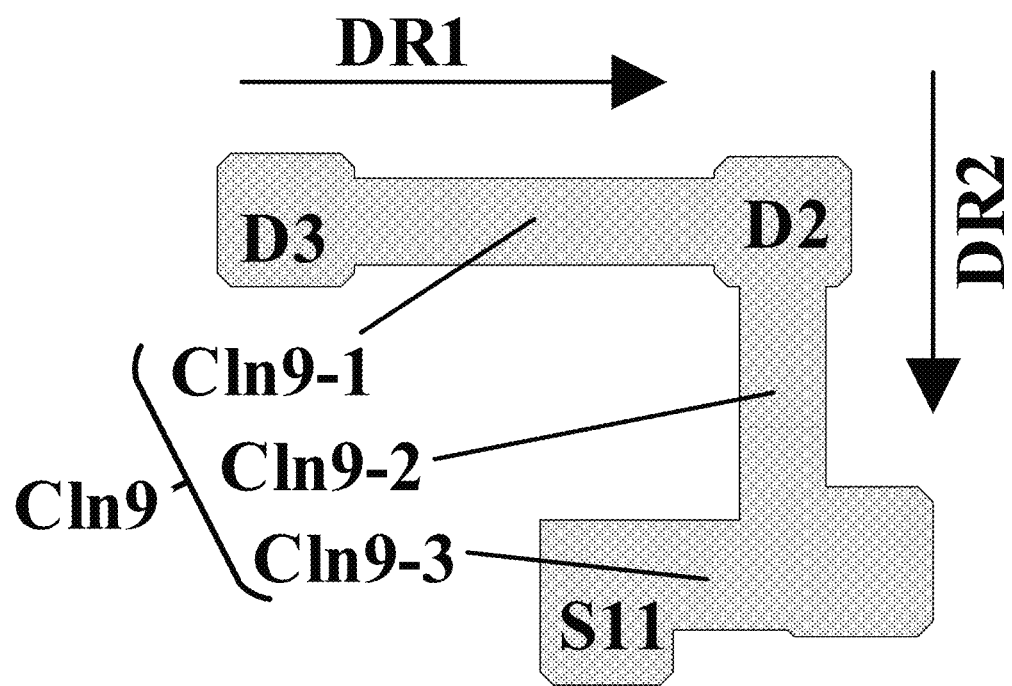
FIG. 17 illustrates the structure of a ninth connecting line in some embodiments according to the present disclosure.

Referring to FIG. 5A to FIG. 5F, and FIG. 6 again, as discussed above, the first signal line layer in some embodiments includes a ninth connecting line Cln9 connecting the second electrode D2 of the second transistor T2, the first electrode S11 of the eleventh transistor T11, the second electrode D3 of the third transistor T3, and the fifth connecting line Cln5 together. FIG. 17 illustrates the structure of a ninth connecting line in some embodiments according to the present disclosure.

Referring to FIG. 17, a first-ninth connecting line part Cln9-1 of the ninth connecting line Cln9 extends substantially along the first direction DR1, a second-ninth connecting line part Cln9-2 of the ninth connecting line Cln9 extends substantially along the second direction DR2, and a third-ninth connecting line part Cln9-3 of the ninth connecting line Cln9 extends substantially along the first direction DR1. The second-ninth connecting line part Cln9-2 connects the first-ninth connecting line part Cln9-1 and the third-ninth connecting line part Cln9-3 together. The first-ninth connecting line part Cln9-1 is a part of the ninth connecting line Cln9 where the ninth connecting line Cln9 connects to the second electrode D3 of the third transistor T3. The first-ninth connecting line part Cln9-1 and the second-ninth connecting line part Cln9-2 of the ninth connecting line Cln9 commonly connect to the second electrode D2 of the second transistor T2. The third-ninth connecting line part Cln9-3 is a part of the ninth connecting line Cln9 where the ninth connecting line Cln9 connects to the first electrode S11 of the eleventh transistor T11 and connects to the fifth connecting line (in the first conductive layer).

Figure 18:
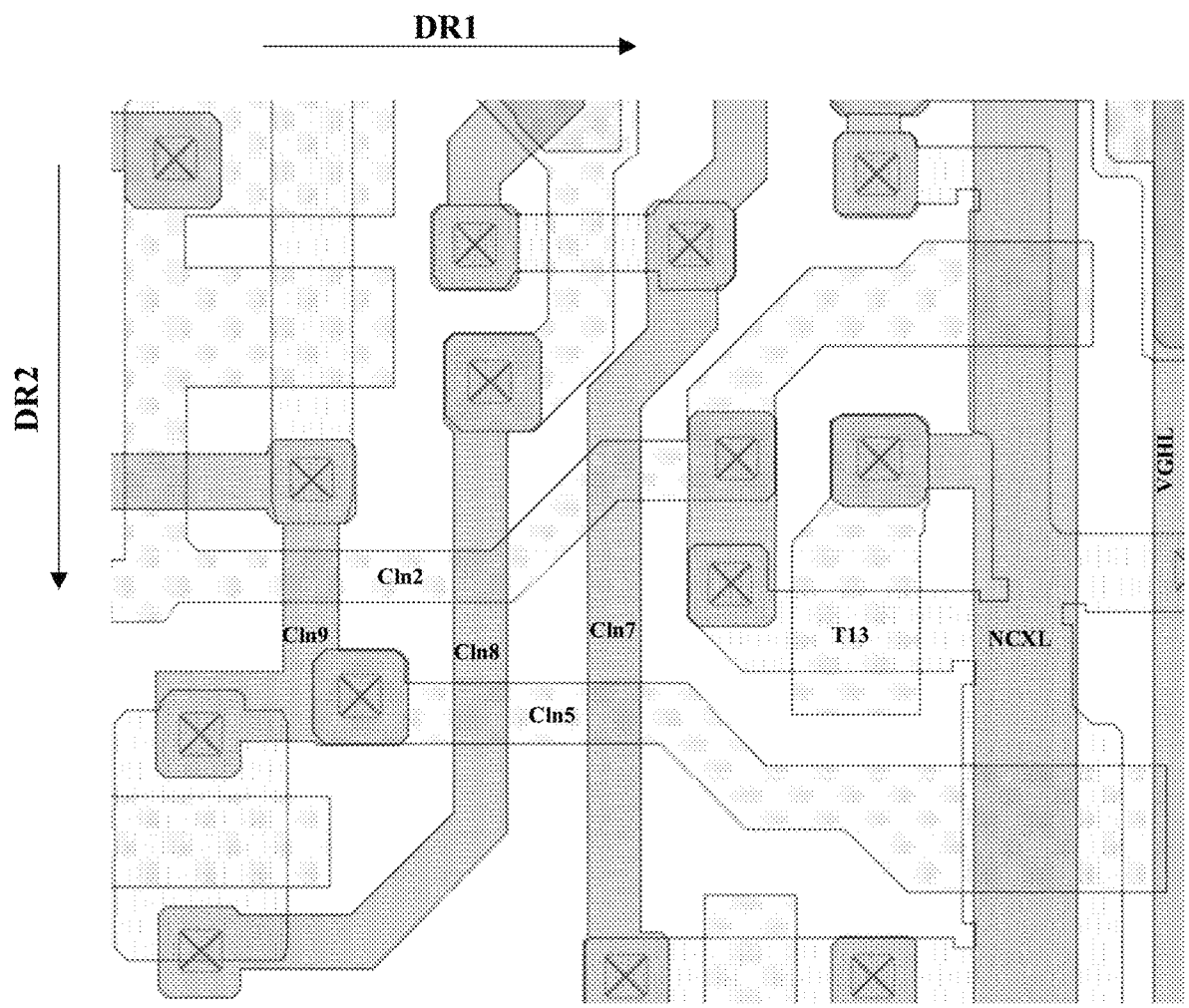
FIG. 18 is a zoom-in view of a region of the scan circuit in some embodiments according to the present disclosure.

FIG. 18 is a zoom-in view of a region of the scan circuit in some embodiments according to the present disclosure. Referring to FIG. 18, the scan circuit in some embodiments includes a unique connecting line arrangement. In some embodiments, the scan circuit in a region includes a grid formed by multiple connecting lines. In one example, the grid is formed by the second connecting line Cln2 and the fifth connecting line Cln5 in the first conductive layer, and the seventh connecting line Cln7, the eighth connecting line Cln8, and the ninth connecting line Cln9 in the first signal line layer. As discussed above, the second connecting line Cln2 connects the gate electrode G8 of the eighth transistor T8, the second electrode D13 of the thirteenth transistor T13, the first electrode S12 of the twelfth transistor T12, and the gate electrode G2 of the second transistor T2 together; the fifth connecting line Cln5 connects a ninth connecting line Cln9 (in the first signal line layer) to the gate electrode G5 of the fifth transistor T5; the seventh connecting line Cln7 connecting the first electrode S6 of the sixth transistor T6, the first electrode S4 of the fourth transistor T4, the gate electrode G7 of the seventh transistor T7 together; the eighth connecting line Cln8 connects the second electrode D11 of the eleventh transistor T11 to the gate electrode G6 of the sixth transistor T6; and the ninth connecting line Cln9 connects the second electrode D2 of the second transistor T2, the first electrode S11 of the eleventh transistor T11, the second electrode D3 of the third transistor T3, and the fifth connecting line Cln5 together.

In some embodiments, at least a portion of the seventh connecting line Cln7, at least a portion of the eighth connecting line Cln8, and at least a portion of the ninth connecting line Cln9 extend substantially along the second direction DR2; at least a portion of the second connecting line Cln2 and at least a portion of the fifth connecting line Cln5 extend substantially along the first direction DR1. The fifth connecting line Cln5 and the ninth connecting line Cln9 are connected to each other through vias. The ninth connecting line Cln9 crosses over the second connecting line Cln2. The eighth connecting line Cln8 crosses over the second connecting line Cln2 and the fifth connecting line Cln5. The seventh connecting line Cln7 crosses over the second connecting line Cln2 and the fifth connecting line Cln5.

Referring to FIG. 18, the thirteenth transistor T13 is in a region surrounded by the seventh connecting line Cln7, the first power supply line VGHL, the second connecting line Cln2, and the fifth connecting line Cln5. The active layer of the thirteenth transistor T13 is in a region surrounded by the seventh connecting line Cln7, the NCX signal line NCXL, the second connecting line Cln2, and the fifth connecting line Cln5.

In another aspect, the present invention provides a display apparatus, including the scan circuit described herein or fabricated by a method described herein, and a display panel having a plurality of light emitting elements. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A scan circuit, comprising a plurality of stages;
   wherein a respective stage of the scan circuit comprises a second processing subcircuit, which comprises a first capacitor, a sixth transistor, and a seventh transistor;
   a first terminal of the first capacitor is coupled to a sixth node, and a second terminal of the first capacitor is coupled to a third node;
   a gate electrode of the sixth transistor is coupled to the sixth node;
   a first electrode of the sixth transistor is coupled to a third input terminal;
   a second electrode of the sixth transistor is coupled to the third node;
   a gate electrode of the seventh transistor is coupled to the third input terminal;
   a first electrode of the seventh transistor is coupled to the third node;
   a second electrode of the seventh transistor is coupled to a fourth node;
   the respective stage of the scan circuit further comprises a sixth connecting line connecting a first electrode of the seventh transistor, a second electrode of the sixth transistor, and a second capacitor electrode of the first capacitor together; and
   the sixth connecting line crosses over both a first capacitor electrode and the second capacitor electrode of the first capacitor;
   wherein the first capacitor electrode of the first capacitor and the gate electrode of the sixth transistor are parts of a unitary structure; and the first capacitor electrode of the first capacitor has a L shape, a first part of the first capacitor electrode extending substantially along a first direction, a second part of the first capacitor electrode extending substantially along a second direction;

wherein the respective stage of the scan circuit further comprises an input subcircuit comprising a first transistor, and an input signal line configured to provide an input signal to the first transistor, a portion of the input signal line extending substantially along the second direction;

a gate electrode of the first transistor is coupled to a second input terminal;

a first electrode of the first transistor is coupled to a first input terminal;

a second electrode of the first transistor is coupled to a fifth node; and a ratio of a width along the first direction of the first part to a shortest distance between the first part and the portion extending substantially along the second direction is no more than 2.0:1.

2. The scan circuit of claim 1, wherein the second capacitor electrode of the first capacitor has a L shape, a third part of the second capacitor electrode extending substantially along a first direction, a fourth part of the second capacitor electrode extending substantially along the second direction; and a ratio of a width along the first direction of the third part to a shortest distance between the third part and the portion extending substantially along the second direction is no more than 2.0:1.

3. The scan circuit of claim 1, wherein an overlapping area between a first capacitor electrode and the second capacitor electrode of the first capacitor is no more than 400 $\mu m^2$.

4. The scan circuit of claim 1, wherein a portion of a semiconductor material layer comprising an active layer of the sixth transistor has a dumbbell shape;

the portion of the semiconductor material layer is connected to a first electrode and a second electrode of the sixth transistor respective at positions corresponding to two heads of the dumbbell shape;

a rod connecting the two heads comprises the active layer of the sixth transistor; and widths along a second direction of the two heads are greater than a width along the second direction of the rod.

5. The scan circuit of claim 1, wherein a ratio of channel width to channel length of an active layer of the sixth transistor is in a range of 0.8:1 to 1:0.8.

6. The scan circuit of claim 1, wherein the respective stage of the scan circuit further comprises an output subcircuit, which comprises a ninth transistor;

a first electrode of the ninth transistor is configured to be provided with a first power supply signal;

a gate electrode of the ninth transistor is coupled to the fourth node;

a second electrode of the ninth transistor is coupled to an output terminal;

an active layer of the ninth transistor comprises m numbers of channels parts spaced apart from each other, m is an integer greater than 2;

a respective channel part of the active layer of the ninth transistor has a channel width and a channel length; and a ratio of (m*the channel width of the respective channel part) to the channel length of the respective channel part is greater than 22:1.

7. The scan circuit of claim 1, wherein the respective stage of the scan circuit further comprises an output subcircuit, which comprises a tenth transistor;

a first electrode of the tenth transistor is configured to be provided with a second power supply signal;

a gate electrode of the tenth transistor is coupled to a first node;

a second electrode of the tenth transistor is coupled to an output terminal;

an active layer of the tenth transistor comprises n numbers of channels parts spaced apart from each other, n is an integer greater than 2;

a respective channel part of the active layer of the tenth transistor has a channel width and a channel length; and a ratio of (n*the channel width of the respective channel part) to the channel length of the respective channel part is greater than 13:1.

8. A scan circuit, comprising a plurality of stages;

wherein a respective stage of the scan circuit comprises a second processing subcircuit, which comprises a first capacitor, a sixth transistor, and a seventh transistor;

a first terminal of the first capacitor is coupled to a sixth node, and a second terminal of the first capacitor is coupled to a third node;

a gate electrode of the sixth transistor is coupled to the sixth node;

a first electrode of the sixth transistor is coupled to a third input terminal;

a second electrode of the sixth transistor is coupled to the third node;

a gate electrode of the seventh transistor is coupled to the third input terminal;

a first electrode of the seventh transistor is coupled to the third node;

a second electrode of the seventh transistor is coupled to a fourth node;

the respective stage of the scan circuit further comprises a sixth connecting line connecting a first electrode of the seventh transistor, a second electrode of the sixth transistor, and a second capacitor electrode of the first capacitor together; and the sixth connecting line crosses over both the first capacitor electrode and the second capacitor electrode of the first capacitor;

wherein the respective stage of the scan circuit further comprises an input subcircuit comprising a first transistor, and an input signal line configured to provide an input signal to the first transistor;

a gate electrode of the first transistor is coupled to a second input terminal;

a first electrode of the first transistor is coupled to a first input terminal;

a second electrode of the first transistor is coupled to a fifth node; and the input signal line comprises a first line portion and a second line portion in two different layers, respectively; and the second line portion comprises at least a portion of the input signal line extending along a part of a periphery of a first capacitor electrode of the first capacitor in a preceding stage of the scan circuit.

9. The scan circuit of claim 1, wherein the respective stage of the scan circuit further comprises:

an output subcircuit, which comprises a ninth transistor and a tenth transistor;

a first electrode of the ninth transistor is configured to be provided with a first power supply signal;

a gate electrode of the ninth transistor is coupled to the fourth node;

a second electrode of the ninth transistor is coupled to an output terminal;

a first electrode of the tenth transistor is configured to be provided with a second power supply signal;

a gate electrode of the tenth transistor is coupled to a first node;

a second electrode of the tenth transistor is coupled to an output terminal;

an output signal line connected to second electrodes of the ninth transistor and the tenth transistor; and an electrostatic discharge portion configured to discharge electrostatic charges accumulated in the output signal line.

10. The scan circuit of claim 9, wherein the output signal line is in a third conductive layer;

the electrostatic discharge portion is in a first signal line layer; and the electrostatic discharge portion is connected to the output signal line through one or more vias extending through a passivation layer.

11. The scan circuit of claim 1, wherein the sixth connecting line has a L shape;

a first-sixth connecting line part of the sixth connecting line extends substantially along the first direction;

a second-sixth connecting line part of the sixth connecting line extends substantially along the second direction; and the second-sixth connecting line part is a part of the sixth connecting line wherein the sixth connecting line connects to the second capacitor electrode of the first capacitor.

12. The scan circuit of claim 1, wherein the respective stage of the scan circuit further comprises a ninth connecting line in a first signal line layer, the ninth connecting line connecting a second electrode of a second transistor, a first electrode of an eleventh transistor, a second electrode of a third transistor, and a fifth connecting line together;

a gate electrode of the second transistor is coupled to a fifth node;

a first electrode of the second transistor is configured to be provided with a first clock signal;

a second electrode of the second transistor is coupled to a second node;

a gate electrode of the third transistor is configured to be provided with the first clock signal;

a first electrode of the third transistor is configured to be provided with a second power supply signal;

a second electrode of the third transistor is coupled to the second node;

a gate electrode of the eleventh transistor is configured to be provided with the second power supply signal;

a first electrode of the eleventh transistor is coupled to the second node;

a second electrode of the eleventh transistor is coupled to a sixth node.

13. The scan circuit of claim 12, wherein a first-ninth connecting line part of the ninth connecting line extends substantially along a first direction, the first-ninth connecting line part being a part of the ninth connecting line where the ninth connecting line connects to a second electrode of a third transistor;

a second-ninth connecting line part of the ninth connecting line extends substantially along a second direction, the first-ninth connecting line part and the second-ninth connecting line part being commonly connect to the second electrode of the second transistor; and a third-ninth connecting line part of the ninth connecting line extends substantially along the first direction, the third-ninth connecting line part being a part of the ninth connecting line where the ninth connecting line connects to a first electrode of the eleventh transistor and connects to the fifth connecting line.

14. A scan circuit, comprising a plurality of stages;

wherein a respective stage of the scan circuit comprises a second processing subcircuit, which comprises a first capacitor, a sixth transistor, and a seventh transistor;

a first terminal of the first capacitor is coupled to a sixth node, and a second terminal of the first capacitor is coupled to a third node;

a gate electrode of the sixth transistor is coupled to the sixth node;

a first electrode of the sixth transistor is coupled to a third input terminal;

a second electrode of the sixth transistor is coupled to the third node;

a gate electrode of the seventh transistor is coupled to the third input terminal;

a first electrode of the seventh transistor is coupled to the third node;

a second electrode of the seventh transistor is coupled to a fourth node;

the respective stage of the scan circuit further comprises a sixth connecting line connecting a first electrode of the seventh transistor, a second electrode of the sixth transistor, and a second capacitor electrode of the first capacitor together; and the sixth connecting line crosses over both the first capacitor electrode and the second capacitor electrode of the first capacitor;

wherein the respective stage of the scan circuit comprises a grid of connecting lines comprising a second connecting line and a fifth connecting line in a first conductive layer, and a seventh connecting line, an eighth connecting line, and a ninth connecting line in a first signal line layer.

15. The scan circuit of claim 14, wherein the second connecting line connects a gate electrode of an eighth transistor, a second electrode of a thirteenth transistor, a first electrode of a twelfth transistor, and a gate electrode of a second transistor together;

the fifth connecting line connects the ninth connecting line to a gate electrode of a fifth transistor;

the seventh connecting line connects a first electrode of the sixth transistor, a first electrode of a fourth transistor, a gate electrode of the seventh transistor together;

the eighth connecting line connects a second electrode of an eleventh transistor to a gate electrode of the sixth transistor; and the ninth connecting line connects a second electrode of the second transistor, a first electrode of the eleventh transistor, a second electrode of a third transistor, and the fifth connecting line together;

a gate electrode of the second transistor is coupled to a fifth node;

a first electrode of the second transistor is configured to be provided with a first clock signal;

a second electrode of the second transistor is coupled to a second node;

a gate electrode of the third transistor is configured to be provided with the first clock signal;

a first electrode of the third transistor is configured to be provided with a second power supply signal;

a second electrode of the third transistor is coupled to the second node;

a gate electrode of the fourth transistor is coupled to a first node;

a first electrode of the fourth transistor is coupled to the third input terminal;

a second electrode of the fourth transistor is coupled to a seventh node;

a gate electrode of the fifth transistor is coupled to the second node;

a first electrode of the fifth transistor is configured to be provided with a first power supply signal;

a second electrode of the fifth transistor is coupled to the seventh node;

a gate electrode of the eleventh transistor is configured to be provided with the second power supply signal;

a first electrode of the eleventh transistor is coupled to the second node;

a second electrode of the eleventh transistor is coupled to a sixth node;

a gate electrode of the twelfth transistor is configured to be provided with the second power supply signal;

a first electrode of the twelfth transistor is coupled to the fifth node;

a second electrode of the twelfth transistor is coupled to a first node.

16. The scan circuit of claim 14, wherein at least a portion of the seventh connecting line, at least a portion of the eighth connecting line, and at least a portion of the ninth connecting line extend substantially along the second direction;

at least a portion of the second connecting line and at least a portion of the fifth connecting line extend substantially along the first direction;

the fifth connecting line and the ninth connecting line are connected to each other through vias;

the ninth connecting line crosses over the second connecting line;

the eighth connecting line crosses over the second connecting line and the fifth connecting line; and the seventh connecting line crosses over the second connecting line and the fifth connecting line.

17. The scan circuit of claim 1, wherein the respective stage of the scan circuit comprises a first processing sub-circuit, which comprises a second capacitor, an eighth transistor, and a thirteenth transistor;

a first capacitor electrode of the second capacitor and a second electrode of the eighth transistor are connected to a second electrode of the seventh transistor;

a gate electrode of the eighth transistor is connected to a second electrode of the thirteenth transistor;

first electrodes of the eighth transistor and the thirteenth transistor are configured to be provided with a first power supply signal; and a gate electrode of the thirteenth transistor is configured to provide the first power supply signal when an emission driving circuit of the scan circuit is in operation, and is configured to provide a second power supply signal when the emission driving circuit of the scan circuit is not in operation.

18. A display apparatus, comprising the scan circuit of claim 1, and a display panel comprising a plurality of light emitting elements.

* * * * *